(12) United States Patent  
Takahashi

(10) Patent No.: US 7,339,233 B2
(45) Date of Patent: Mar. 4, 2008

(54) NONVOLATILE SEMICONDUCTOR MEMORY DEVICE AND MANUFACTURING METHOD THEREOF

(75) Inventor: Keita Takahashi, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/135,305

(22) Filed: May 24, 2005

(65) Prior Publication Data

US 2005/0270845 A1 Dec. 8, 2005

(30) Foreign Application Priority Data

Jun. 4, 2004 (JP) ............... 2004-166653

(51) Int. Cl.
*H01L 29/792* (2006.01)
(52) U.S. Cl. ...................... 257/324; 257/326
(58) Field of Classification Search ......... 257/314–326
See application file for complete search history.

(56) References Cited

U.S. PATENT DOCUMENTS 6,114,767 A * 9/2000 Nagai et al. ................ 257/758
6,963,102 B2 * 11/2005 Mori .......................... 257/315
7,082,057 B2 * 7/2006 Shibata et al. ........... 365/185.2
2002/0113257 A1 * 8/2002 Osabe et al. ................ 257/316

FOREIGN PATENT DOCUMENTS

JP       2003-243545       8/2003

* cited by examiner

*Primary Examiner*—Cuong Nguyen
(74) *Attorney, Agent, or Firm*—McDermott Will & Emery LLP

(57) ABSTRACT

A nonvolatile semiconductor memory device includes nonvolatile semiconductor memory elements and a first conductor. Each nonvolatile semiconductor memory element includes a gate insulating film including a charge trapping layer formed on a substrate, a gate electrode formed on the gate insulating film, and a pair of diffusion layers formed in a surface layer of the substrate with the gate electrode interposed therebetween and functioning as a source or a drain. The first conductor electrically connects a pair of diffusion layers of each nonvolatile semiconductor memory element to each other. Ends of each gate electrode which respectively face a pair of diffusion layers of a corresponding nonvolatile semiconductor memory element are partially covered by the first conductor when viewed two-dimensionally.

21 Claims, 30 Drawing Sheets

_US 7,339,233 B2_

NONVOLATILE SEMICONDUCTOR MEMORY DEVICE AND MANUFACTURING METHOD THEREOF

CROSS REFERENCE TO RELATED APPLICATIONS

This application claims priority under 35 U.S.C. §119 on Patent Application No. 2004-166653 filed in Japan on Jun. 4, 2004, the entire contents of which are hereby incorporated by reference.

BACKGROUND OF THE INVENTION

The present invention generally relates to a nonvolatile semiconductor memory device and a manufacturing method thereof. More particularly, the present invention relates to a memory-element array method of a semiconductor memory device which uses a non-conductive charge trapping layer for memory elements.

MONOS (Metal Oxide Nitride Oxide Silicon) memory technology has been proposed in response to recent improvement in integration and reduction in costs of nonvolatile semiconductor memory devices. The MONOS memory technology is characterized in that a non-conductive charge trapping layer (e.g., SiN) is used for memory elements and charges are locally trapped in the charge trapping layer.

Conventional MONOS memories can store only one-bit data in each memory cell because charges are accumulated in the whole non-conductive charge trapping layer in gate regions. In recently developed local-trapping MONOS memory technology, however, charges are locally trapped in a non-conductive charge trapping layer (e.g., SiN), which enables 2-bit data to be stored in each memory cell. The local-trapping MONOS memory technology is therefore advantageous for improvement in integration and reduction in costs.

However, local-trapping MONOS memories can malfunction when charges are accumulated in a non-conductive charge trapping layer due to ultraviolet (UV) rays which are generated during the manufacturing process.

A technology of forming a UV absorbing layer under first metal wirings has been proposed in view of the above problem (e.g., Japanese Laid-Open Patent Publication No. 2003-243545).

Hereinafter, a conventional example in which a UV absorbing layer is formed under first metal wirings will be described with reference to the figures.

First, a memory cell array structure will be described with reference to the figures.

FIG. 25 is a circuit diagram showing an electric connection method of a common memory cell array.

As shown in FIG. 25, word lines (WL0a, WL1a, WL2a, WL3a) extend in the row direction (word-line direction) and bit lines (BL0a, BL1a, BL2a, BL3a, BL4a) extend in the column direction (bit-line direction). Although not shown in FIG. 25, a memory cell array is usually formed from a multiplicity of word lines and a multiplicity of bit lines. For simplicity, FIG. 25 shows a circuit diagram of only sixteen memory cells. Word lines electrically connect gate electrodes of memory cells arranged in the row direction, and bit lines electrically connect source/drain diffusion layers of memory cells arranged in the column direction. Source/drain diffusion layers of adjacent memory cells in the row direction are electrically short-circuited. Memory cells can thus be densely arranged in a memory cell array.

FIG. 26 is a plan view of the memory cell array shown in FIG. 25.

As shown in FIG. 26, word line electrodes 2 extend in the row direction and bit line diffusion layers 1 extend in the column direction. Each word line electrode 2 forms a word line (WL0a, WL1a, WL2a, WL3a) and each bit line diffusion layer 1 forms a bit line (BL0a, BL1a, BL2a, BL3a, BL4a). An isolation diffusion layer 3 is formed between adjacent bit line diffusion layers 1 in order to electrically isolate adjacent bit line diffusion layers 1 from each other. A contact 4 is formed every few bits for each bit line diffusion layer 1 and each word line electrode 2. Each bit line diffusion layer 1 and each word line electrode 2 are electrically connected to a corresponding metal wiring (not shown) through corresponding contacts 4. A UV absorbing layer 5 covers the memory cell array. Functions of the UV absorbing layer 5 will be described later.

FIG. 27 is a plan view of the memory cell array and shows cutting planes A-A, B-B, C-C and D-D corresponding to the cross-sectional views of FIG. 28 through FIG. 36A and 36B.

FIG. 28 is a cross-sectional view of the memory cell array taken along line A-A of FIG. 27.

As shown in FIG. 28, the memory cell array includes a P-type well 11, bit line diffusion layers 1, a non-conductive charge trapping layer 12, word line electrodes 2, a first interlayer insulating film 13, a UV absorbing layer 5, a first additional interlayer insulating film 14, contacts 4, first metal wirings 15, a second interlayer insulating film 16, first via holes 17, second metal wirings 18, and a surface protective film 19. Each second metal wiring 18 is electrically connected to a corresponding word line electrode 2 every few bits through corresponding first via holes 17, two of the six first metal wirings 15 shown in the figure (i.e., the ones located at both ends), and corresponding contacts 4 in order to reduce the word line resistance. Each of the remaining four first metal wirings 15 (the middle four first metal wirings) is electrically connected to a corresponding bit line diffusion layer 1 every few bits (see FIG. 30) in order to reduce the bit line resistance.

FIG. 29 is a cross-sectional view of the memory cell array taken along line B-B in FIG. 27.

As shown in FIG. 29, bit line diffusion layers 1 and isolation diffusion layers 3 are alternately formed between the charge trapping layer 12 and the P-type well 11. Adjacent bit line diffusion layers 1 are thus electrically isolated from each other by the isolation diffusion layers 3 and the P-type well 11.

FIG. 30 is a cross-sectional view of the memory cell array taken along line C-C of FIG. 27.

As shown in FIG. 30, each first metal wiring 15 is electrically connected to a corresponding bit line diffusion layer 1 every few bits through corresponding contacts 4 in order to reduce the bit line resistance. As described above, each second metal wiring 18 is electrically connected to a corresponding word line electrode 2 every few bits (see FIG. 31) in order to reduce the word line resistance.

FIG. 31 is a cross-sectional view of the memory cell array taken along line D-D of FIG. 27.

As shown in FIG. 31, the isolation diffusion layers 3 are formed in the P-type well 11 in a self-aligned manner so that adjacent word line electrodes 2 are electrically isolated from each other.

FIG. 32A is a cross-sectional view (in the gate length direction) of a single memory cell which is formed from the P-type well 11, bit line diffusion layers 1, the charge trapping layer 12 and a word line electrode 2 in FIG. 28.

As shown in FIG. 32A, a bit line diffusion layer 1*a* serves as a drain portion, a bit line diffusion layer 1*b* serves as a source portion, the P-type well 11 serves as a channel portion, the charge trapping layer 12 (non-conductive) serves as a gate insulating film, and the word line electrode 2 serves as a gate electrode. The memory transistor of FIG. 32A therefore has the same functions as those of a common MOS (Metal Oxide Semiconductor) transistor. The memory transistor of FIG. 32A is different from a common MOS transistor in that the drain portion (bit line diffusion layer 1*a*) and the source portion (bit line diffusion layer 1*b*) are embedded under the gate electrode (word line electrode 2) and in that the gate insulating film is formed from the charge trapping layer 12. Note that the bit line diffusion layers 1*a* and 1*b* are herein respectively referred to as a drain portion and a source portion based on their functions in read operation (see FIG. 33C).

FIG. 32B is a cross-sectional view (in the gate width direction) of a single memory cell which is formed from the P-type well 11, the isolation diffusion layers 3, the charge trapping layer 12 and a word line electrode 2 in FIG. 31.

As shown in FIG. 32B, the width of the P-type well 11 interposed between the isolation diffusion layers 3 is a gate width.

Basic operation of the memory cell shown in FIGS. 32A and 32B will be described with reference to FIGS. 33A to 33C.

FIG. 33A illustrates write operation of the memory cell. Like FIG. 32A, FIG. 33A is a cross-sectional view of the memory cell in the gate length direction.

As shown in FIG. 33A, a voltage of 10V is applied to the word line electrode 2, 5V is applied to the bit line diffusion layer 1*b*, 0V is applied to the bit line diffusion layer 1*a* and 0V is applied to the P-type well 11. As a result, channel hot electrons are generated in the boundary region between the bit line diffusion layer 1*b* and the P-type well 11. Electrons thus generated are injected into the charge trapping layer 12. More specifically, electrons are locally injected into a region of the charge trapping layer 12 which is located on the boundary region between the bit line diffusion layer 1*b* and the P-type well 11.

FIG. 33B illustrates erase operation of the memory cell. Like FIG. 32A, FIG. 33B is a cross-sectional view of the memory cell in the gate length direction.

As shown in FIG. 33B, a voltage of −6V is applied to the word line electrode 2, 5V is applied to the bit line diffusion layer 1*b*, 0V is applied to the bit line diffusion layer 1*a* and 0V is applied to the P-type well 11. As a result, hot holes are generated in the boundary region between the bit line diffusion layer 1*b* and the P-type well 11 due to an interband tunneling current. Holes thus generated are injected into the charge trapping layer 12. Electrons injected in the write operation are thus electrically neutralized.

FIG. 33C illustrates read operation of the memory cell. Like FIG. 32A, FIG. 33C is a cross-sectional view of the memory cell in the gate length direction.

As shown in FIG. 33C, a voltage of 4V is applied to the word line electrode 2, 0V is applied to the bit line diffusion layer 1*b*, 1V is applied to the bit line diffusion layer 1*a*, and 0V is applied to the P-type well 11. When data has been stored in the memory cell, electrons have been trapped in the region of the charge trapping layer 12 which is close to the bit line diffusion layer 1*b*. The memory cell therefore has a high threshold voltage, and a source-drain current does not flow in response to the voltage application. On the other hand, when data has been erased from the memory cell, electrons trapped in write operation have been electrically neutralized in the region of the charge trapping layer 12 which is close to the bit line diffusion layer 1*b*. The memory cell therefore has a low threshold voltage, and a source-drain current flows in response to the voltage application.

Local-trapping MONOS memories are thus characterized in that electrons are locally trapped in the charge trapping layer 12 and in that a source-drain current flows in the opposite directions in write operation and read operation.

Hereinafter, the effects of the UV absorbing layer 5 will be described with reference to FIG. 34 to FIGS. 36A and 36B.

In a semiconductor manufacturing process, ultraviolet (UV) rays (λ<400 nm) are generated in various processes such as a lithography process, a plasma CVD (Chemical Vapor Deposition) process and a reactive ion etching process. In particular, UV rays having energy exceeding 4.3 eV (λ<290 nm) excite electrons in the substrate and accumulate electrons in the charge trapping layer 12.

Hereinafter, effects of UV rays which are generated after formation of the first metal wirings 15 will be described by way of example.

FIG. 34 is a cross-sectional view of the memory cell array taken along line B-B of FIG. 27. It is assumed in FIG. 34 that the memory cell array does not have the UV absorbing layer 5.

As shown in FIG. 34, the first metal wirings 15 reflect UV rays and function as a light-shielding film. As can be seen from FIG. 34, however, UV rays reach the isolation diffusion layers 3 through the regions between the first metal wirings 15. Therefore, charges are accumulated in the regions of the charge trapping layer 12 which are located on the isolation diffusion layers 3.

Like FIG. 32B, FIG. 35 is a cross-sectional view of a single memory cell in the memory cell array taken along line D-D of FIG. 27. In FIG. 35, UV rays generated during the manufacturing process have caused electrons to be accumulated in the regions of the charge trapping layer 12 which are located on the isolation diffusion layers 3.

As can be seen from FIG. 35, electrons have been trapped not only in the regions of the charge trapping layer 12 which are not covered by the first metal wirings 5 but also in the regions of the charge trapping layer 12 which are located under both ends of the word line electrode 2 which face the isolation diffusion layers 3. This is caused primarily by UV rays which are reflected in an oblique direction.

Like FIG. 32A, FIG. 36A is a cross-sectional view of a single memory cell in the memory cell array taken along line A-A of FIG. 27. FIG. 36A shows the same state as that of FIG. 35. In FIG. 36A, line A-A runs through the central region of the word line electrode 2.

As can be seen from FIG. 36A, electrons have not been trapped in the central region of the word line electrode 2. As described above with respect to FIG. 35, electrons are trapped not only in the regions of the charge trapping layer 12 which are not covered by the first metal wirings 5 but also in the regions of the charge trapping layer 12 which are located under both ends of the word line electrode 2 which face the isolation diffusion layers 3. As shown in FIG. 35, however, electrons are not trapped in the region of the charge trapping layer 12 which is located under the central region of the word line electrode 2. Therefore, electrons have not been trapped in the charge trapping layer 12 in FIG. 36A.

Like FIG. 32A, FIG. 36B is a cross-sectional view of a single memory cell in the memory cell array taken along line A-A of FIG. 27. FIG. 36B shows the same state as that of FIG. 35. In FIG. 36B, line A-A runs through an end (edge region) of the word line electrode 2.

As can be seen from FIG. 36B, electrons have been trapped in the region of the charge trapping layer 12 which is located under the end of the word line electrode 2. As described above with respect to FIG. 35, electrons are trapped not only in the regions of the charge trapping layer 12 which are not covered by the first metal wirings 15 but also in the regions of the charge trapping layer 12 which are located under both ends of the word line electrode 2 which face the isolation diffusion layers 3. Therefore, electrons have been trapped in the charge trapping layer 12 in FIG. 36B.

As shown in FIG. 36B, under the end of the word line electrode 2, electrons have been trapped in the entire charge trapping layer 12 in the gate length direction. In this case, a threshold voltage is increased in this region. When a threshold voltage is increased in a large region of the charge trapping layer 12 in the gate width direction as shown in FIG. 35, erase operation of memory cells cannot be conducted as described with respect to FIG. 33B, impairing memory operation.

In view of the above problems, the conventional example has the UV absorbing layer 5 under the first metal wirings 15 as shown in FIGS. 26 to 31 in order to prevent increase in threshold voltage of memory cells due to UV rays which are generated during the manufacturing process.

However, when dimensions of wirings of bit line diffusion layers are reduced for miniaturization of nonvolatile semiconductor memory devices, the bit line resistance is increased, thereby impairing memory operation.

Bit lines can be formed from metal wirings in order to reduce the bit line resistance, but this causes the following problems.

The above conventional example has the UV absorbing layer 5 between the first interlayer insulating film 13 and the first additional interlayer insulating film 14 in order to suppress increase in threshold voltage of memory cells. This structure can be used because the contacts 4 are formed in the peripheral region of the memory cell array.

When bit lines are formed from metal wirings, it is usually required to form the contacts 4 all over the memory cell array. Therefore, when bit lines are formed from metal wirings, the use of the structure of the conventional example is not practical for the following reasons: holes for the contacts 4 need to be formed in the UV absorbing layer 5; and the UV absorbing layer 5 must be formed from a material that is capable of suppressing a leakage current to approximately zero (about 0.1 µA or less between bit lines) in order to suppress a leakage current through the UV absorbing layer 5. It is therefore extremely important how to eliminate the effects of UV rays which are generated during the manufacturing process.

SUMMARY OF THE INVENTION

In view of the above problems, it is an object of the present invention to eliminate effects of ultraviolet (UV) rays which are generated during a manufacturing process on a semiconductor memory device having bit lines formed from metal wirings.

In order to solve the above problems, a nonvolatile semiconductor memory device according to a first aspect of the present invention includes nonvolatile semiconductor memory elements and a first conductor. Each nonvolatile semiconductor memory element includes a gate insulating film including a charge trapping layer formed on a substrate, a gate electrode formed on the gate insulating film, and a pair of diffusion layers formed in a surface layer of the substrate with the gate electrode interposed therebetween and functioning as a source or a drain. The first conductor electrically connects a pair of diffusion layers of each nonvolatile semiconductor memory element to each other. Ends of each gate electrode which respectively face a pair of diffusion layers of a corresponding nonvolatile semiconductor memory element are partially covered by the first conductor when viewed two-dimensionally.

In the nonvolatile semiconductor memory device of the first aspect, the ends of each gate electrode which respectively face a pair of diffusion layers of a corresponding nonvolatile semiconductor memory element are partially covered by the first conductor when viewed two-dimensionally. This structure can prevent increase in threshold voltage of memory cells due to ultraviolet (UV) rays which are generated in any step after formation of the first conductor. Moreover, the above structure can be easily implemented. The effects of UV rays can therefore be easily prevented even when metal wirings are used as bit lines for miniaturization of devices.

A nonvolatile semiconductor memory device according to a second aspect of the present invention includes a memory cell array and bit lines. The memory cell array has nonvolatile semiconductor memory elements arranged in a matrix in a word line direction and a bit line direction. Each nonvolatile semiconductor memory element includes a gate insulating film including a charge trapping layer formed on a substrate, a gate electrode formed on the gate insulating film, and a pair of diffusion layers formed in a surface layer of the substrate with the gate electrode interposed therebetween and functioning as a source or a drain. The bit lines connect every other pair of diffusion layers of a plurality of nonvolatile semiconductor memory elements arranged in the bit line direction. The bit lines include first conductors for electrically connecting adjacent diffusion layers of adjacent nonvolatile semiconductor memory elements of the word line direction, and second conductors for connecting a plurality of first conductors arranged in the bit line direction. Ends of each gate electrode which respectively face a pair of diffusion layers of a corresponding nonvolatile semiconductor memory element are partially covered by a corresponding first conductor when viewed two-dimensionally.

In the nonvolatile semiconductor memory device of the second aspect, the ends of each gate electrode which respectively face a pair of diffusion layers of a corresponding nonvolatile semiconductor memory element are partially covered by a corresponding first conductor when viewed two-dimensionally. This structure can prevent increase in threshold voltage of memory cells due to UV rays which are generated in any step after formation of the first conductors. Moreover, the above structure can be easily implemented. The effects of UV rays can therefore be easily prevented even when metal wirings are used as bit lines for miniaturization of devices.

In the nonvolatile semiconductor memory device of the first or second aspect, the ends of each gate electrode which respectively face a pair of diffusion layers of a corresponding nonvolatile semiconductor memory element are preferably completely covered by the first conductor when viewed two-dimensionally.

This structure can completely eliminate the effects of UV rays and therefore can more reliably prevent increase in threshold voltage of memory cells.

In the nonvolatile semiconductor memory device of the first or second aspect, the first conductor is preferably formed from polysilicon with a thickness of at least 50 nm. The purpose of this is to obtain a sufficiently low resistance for memory operation. The use of polysilicon enables reduction in memory cell size.

In the nonvolatile semiconductor memory device of the first or second aspect, the first conductor is preferably formed from a metal wiring.

This structure can reduce the bit line resistance and therefore can implement miniaturization of devices.

In the nonvolatile semiconductor memory device of the first or second aspect, the first conductor preferably includes a first contact and a first wiring. The first contact is formed from a metal and has its bottom end connecting to the diffusion layers. The first wiring is formed from a metal and has its bottom surface connecting to a top end of the first contact.

In the nonvolatile semiconductor memory device of the second aspect, the second conductor preferably includes a second contact and a second wiring. The second contact is formed from a metal and has its bottom end connecting to a top surface of the first conductor. The second wiring is formed from a metal and has its bottom surface connecting to a top end of the second contact.

In the nonvolatile semiconductor memory device of the second aspect, the ends of each gate electrode which respectively face a pair of diffusion layers of a corresponding nonvolatile semiconductor memory element are preferably partially covered by a corresponding second conductor when viewed two-dimensionally.

In this case, the ends of each gate electrode which respectively face a pair of diffusion layers of a corresponding nonvolatile semiconductor memory element are partially covered also by a corresponding second conductor when viewed two-dimensionally. This structure can further prevent increase in threshold voltage of memory cells due to UV rays which are generated in any step after formation of the second conductors. Moreover, the above structure can be easily implemented. The effects of UV rays can therefore be easily prevented even when metal wirings are used as bit lines for miniaturization of devices.

In the nonvolatile semiconductor memory device of the second aspect, the ends of each gate electrode which respectively face a pair of diffusion layers of a corresponding nonvolatile semiconductor memory element are completely covered by a corresponding second conductor when viewed two-dimensionally.

This structure can completely eliminate the effects of UV rays and therefore can more reliably prevent increase in threshold voltage of memory cells.

A nonvolatile semiconductor memory device according to a third aspect of the present invention includes a memory cell array and bit lines. The memory cell array has nonvolatile semiconductor memory elements arranged in a matrix in a word line direction and a bit line direction. Each nonvolatile semiconductor memory element includes a gate insulating film including a charge trapping layer formed on a substrate, a gate electrode formed on the gate insulating film, and a pair of diffusion layers formed in a surface layer of the substrate with the gate electrode interposed therebetween and functioning as a source or a drain. The bit lines connect every other pair of diffusion layers of a plurality of nonvolatile semiconductor memory elements arranged in the bit line direction. The bit lines include first conductors for electrically connecting adjacent diffusion layers of adjacent nonvolatile semiconductor memory elements of the word line direction, and second conductors for connecting a plurality of first conductors arranged in the bit line direction. Ends of each gate electrode which respectively face a pair of diffusion layers of a corresponding nonvolatile semiconductor memory element are partially covered by a corresponding second conductor when viewed two-dimensionally.

In the nonvolatile semiconductor memory device of the third aspect, the ends of each gate electrode which respectively face a pair of diffusion layers of a corresponding nonvolatile semiconductor memory element are partially covered by a corresponding second conductor when viewed two-dimensionally. This structure can prevent increase in threshold voltage of memory cells due to UV rays which are generated in any step after formation of the second conductors. Moreover, the above structure can be easily implemented. The effects of UV rays can therefore be easily prevented even when metal wirings are used as bit lines for miniaturization of devices.

In the nonvolatile semiconductor memory device of the third aspect, the ends of each gate electrode which respectively face a pair of diffusion layers of a corresponding nonvolatile semiconductor memory element are preferably completely covered by a corresponding second conductor when viewed two-dimensionally.

This structure can completely eliminate the effects of UV rays and therefore can more reliably prevent increase in threshold voltage of memory cells.

In the nonvolatile semiconductor memory device of the first, second or third aspect, the charge trapping layer preferably has a multi-layer structure including a silicon oxide film and a silicon nitride film.

In the nonvolatile semiconductor memory device of the first, second or third aspect, the charge trapping layer is preferably formed from a silicon oxide film with fine silicon lumps dispersed therein.

According to a fourth aspect of the present invention, a method for manufacturing a nonvolatile semiconductor memory device includes the step of forming a memory cell array having nonvolatile semiconductor memory elements arranged in a matrix in a word line direction and a bit line direction. Each nonvolatile semiconductor memory element includes a gate insulating film including a charge trapping layer formed on a substrate, a gate electrode formed on the gate insulating film, and a pair of diffusion layers formed in a surface layer of the substrate with the gate electrode interposed therebetween and functioning as a source or a drain. The method further includes the steps of forming an insulating film on the charge trapping layer so as to cover the gate electrodes, and forming bit lines for connecting every other pair of diffusion layers of a plurality of nonvolatile semiconductor memory elements arranged in the bit line direction. The step of forming bit lines includes the step of forming first conductors of polysilicon extending through the charge trapping layer and the insulating film for electrically connecting adjacent diffusion layers of adjacent nonvolatile semiconductor memory elements of the word line direction, and the step of forming second conductors for connecting a plurality of first conductors arranged in the bit line direction. Ends of each gate electrode which respectively face a pair of diffusion layers of a corresponding nonvolatile semiconductor memory element are partially covered by a corresponding first conductor when viewed two-dimensionally.

In the method of the fourth aspect, the ends of each gate electrode which respectively face a pair of diffusion layers of a corresponding nonvolatile semiconductor memory element are partially covered also by a corresponding first conductor when viewed two-dimensionally. This structure can prevent increase in threshold voltage of memory cells due to UV rays which are generated in any step after formation of the first conductors. Moreover, the above structure can be easily implemented. The effects of UV rays can therefore be easily prevented even when metal wirings are used as bit lines for miniaturization of devices. Miniaturization of devices can be easily implemented because the first conductors are formed from polysilicon.

In the method of the fourth aspect, the ends of each gate electrode which respectively face a pair of diffusion layers of a corresponding nonvolatile semiconductor memory element are partially covered by a corresponding second conductor when viewed two-dimensionally.

In this case, the ends of each gate electrode which respectively face a pair of diffusion layers of a corresponding nonvolatile semiconductor memory element are partially covered also by a corresponding second conductor when viewed two-dimensionally. This structure can further prevent increase in threshold voltage of memory cells due to UV rays which are generated in any step after formation of the second conductors.

As has been described above, according to the present invention, the ends of each gate electrode which respectively face a pair of diffusion layers of a corresponding nonvolatile semiconductor memory element are partially covered by a conductor. This structure can prevent increase in threshold voltage of memory cells due to UV rays which are generated in any step after formation of the conductor. Moreover, the structure of the present invention can be implemented by a simple method without using a UV absorbing layer of the conventional example. The effects of UV rays can therefore be easily prevented even when metal wirings are used as bit lines for miniaturization of devices.

BRIEF DESCRIPTION OF THE DRAWINGS

FIGS. 19A and 19B illustrate a method for manufacturing a semiconductor device according to the second embodiment of the present invention, wherein FIG. 19A is a cross-sectional view of the memory cell array taken along line E-E in FIG. 16 and FIG. 19B is a cross-sectional view of the memory cell array taken along line F-F in FIG. 16;

FIGS. 20A and 20B illustrate a method for manufacturing a semiconductor device according to the second embodiment of the present invention, wherein FIG. 20A is a cross-sectional view of the memory cell array taken along line E-E in FIG. 16 and FIG. 20B is a cross-sectional view of the memory cell array taken along line F-F in FIG. 16;

FIGS. 21A and 21B illustrate a method for manufacturing a semiconductor device according to the second embodiment of the present invention, wherein FIG. 21A is a cross-sectional view of the memory cell array taken along line E-E in FIG. 16 and FIG. 21B is a cross-sectional view of the memory cell array taken along line F-F in FIG. 16;

FIGS. 22A and 22B illustrate a method for manufacturing a semiconductor device according to the second embodiment of the present invention, wherein FIG. 22A is a cross-sectional view of the memory cell array taken along line E-E in FIG. 16 and FIG. 22B is a cross-sectional view of the memory cell array taken along line F-F in FIG. 16;

FIGS. 23A and 23B illustrate a method for manufacturing a semiconductor device according to the second embodiment of the present invention, wherein FIG. 23A is a cross-sectional view of the memory cell array taken along line E-E in FIG. 16 and FIG. 23B is a cross-sectional view of the memory cell array taken along line F-F in FIG. 16;

FIGS. 24A and 24B illustrate a method for manufacturing a semiconductor device according to the second embodiment of the present invention, wherein FIG. 24A is a cross-sectional view of the memory cell array taken along line E-E in FIG. 16 and FIG. 24B is a cross-sectional view of the memory cell array taken along line F-F in FIG. 16;

DETAILED DESCRIPTION OF THE INVENTION

First Embodiment

Hereinafter, a semiconductor device and a manufacturing method thereof according to a first embodiment of the present invention will be described with reference to the drawings.

First, an electric connection method of a memory cell array of the first embodiment will be described with reference to FIG. 1.

Figure 1:
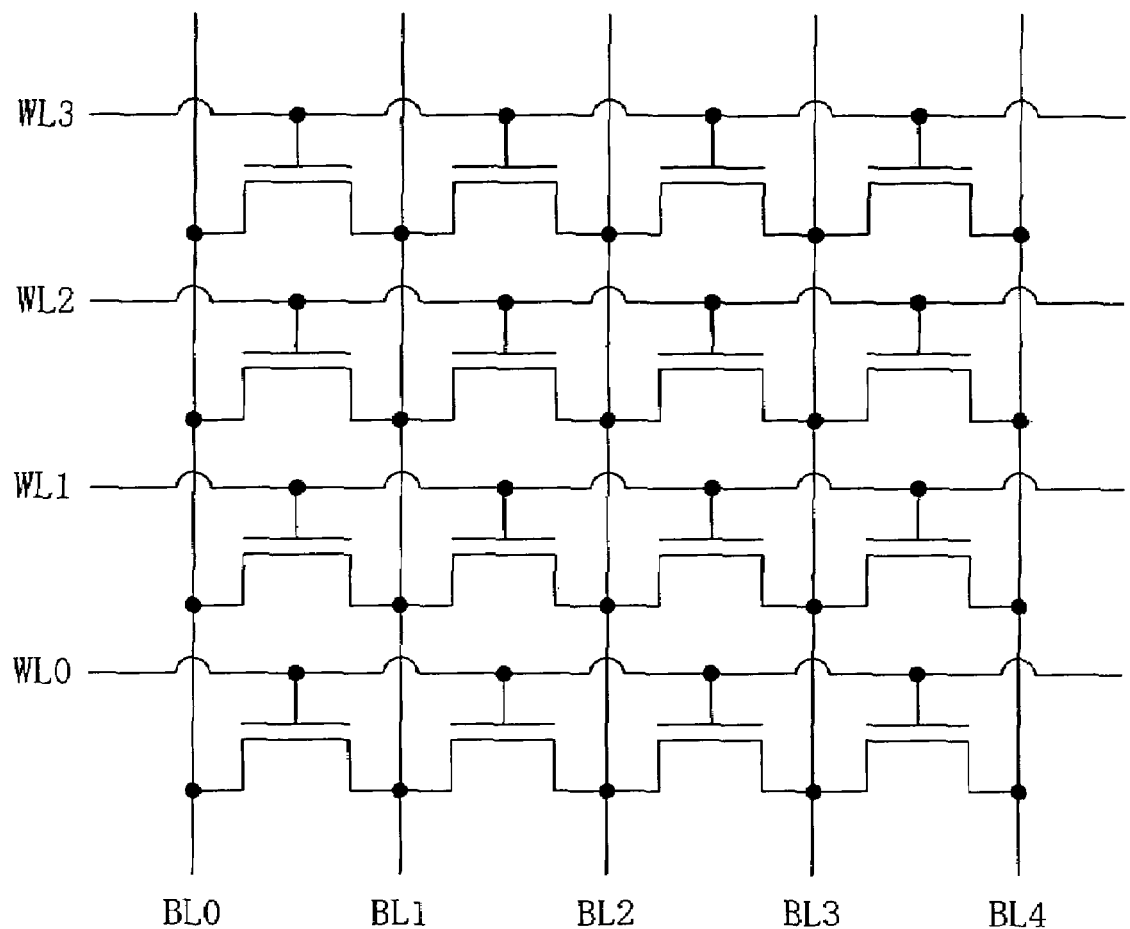
FIG. 1 is a circuit diagram showing an electric connection method of a memory cell array according to a first embodiment of the present invention.

FIG. 1 is a circuit diagram illustrating an electric connection method of the memory cell array of the first embodiment.

As shown in FIG. 1, word lines (WL0, WL1, WL2, WL3) extend in the row direction (word line direction) and bit lines (BL0, BL1, BL2, BL3, BL4) extend in the column direction (bit line direction). Although not shown in FIG. 1, a memory cell array is usually formed from a multiplicity of word lines and a multiplicity of bit lines. For simplicity, FIG. 1 shows a circuit diagram of only sixteen memory cells. Word lines electrically connect gate electrodes of memory cells arranged in the row direction, and bit lines electrically connect source/drain diffusion layers of memory cells arranged in the column direction. Source/drain diffusion layers of adjacent memory cells in the row direction are electrically short-circuited.

Figure 2:
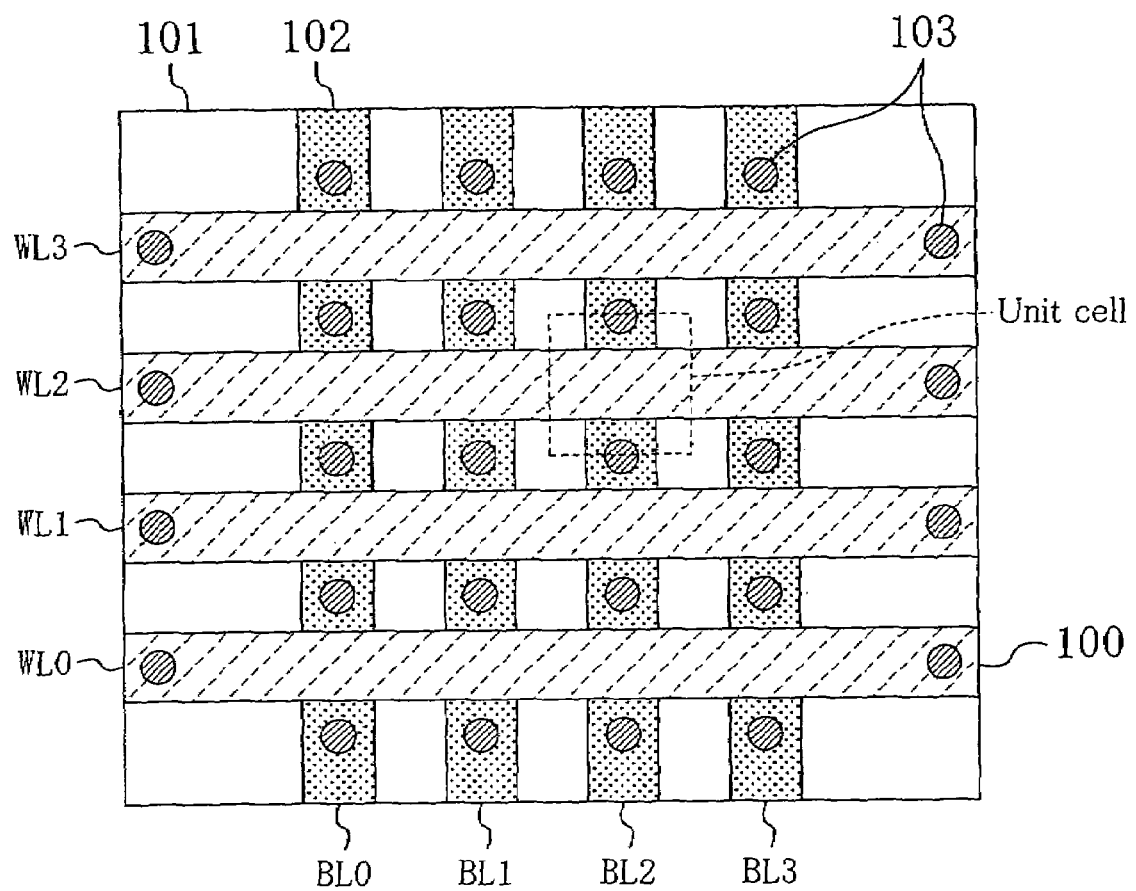
FIG. 2 is a plan view of the memory cell array of the first embodiment and shows the state right after the step of forming contacts is completed.

FIG. 2 is a plan view of the memory cell array of FIG. 1. FIG. 2 shows the state right after the step of forming contacts is completed.

As shown in FIG. 2, word line electrodes 100 forming word lines extend in the row direction and element isolation insulating films 101 extend in the column direction perpendicularly to the word line electrodes 100. Metal wirings forming bit lines extend in the column direction perpendicularly to the word line electrodes 100. These metal wirings are not shown in FIG. 2 because they are formed in a step later than the step shown in FIG. 2 (see FIG. 4). Source/drain diffusion layers 102 are formed in the regions surrounded by the word line electrodes 100 and the element isolation insulating films 101. A contact 103 forming a bit line is formed in each of the source/drain diffusion layers 102.

Figure 3:
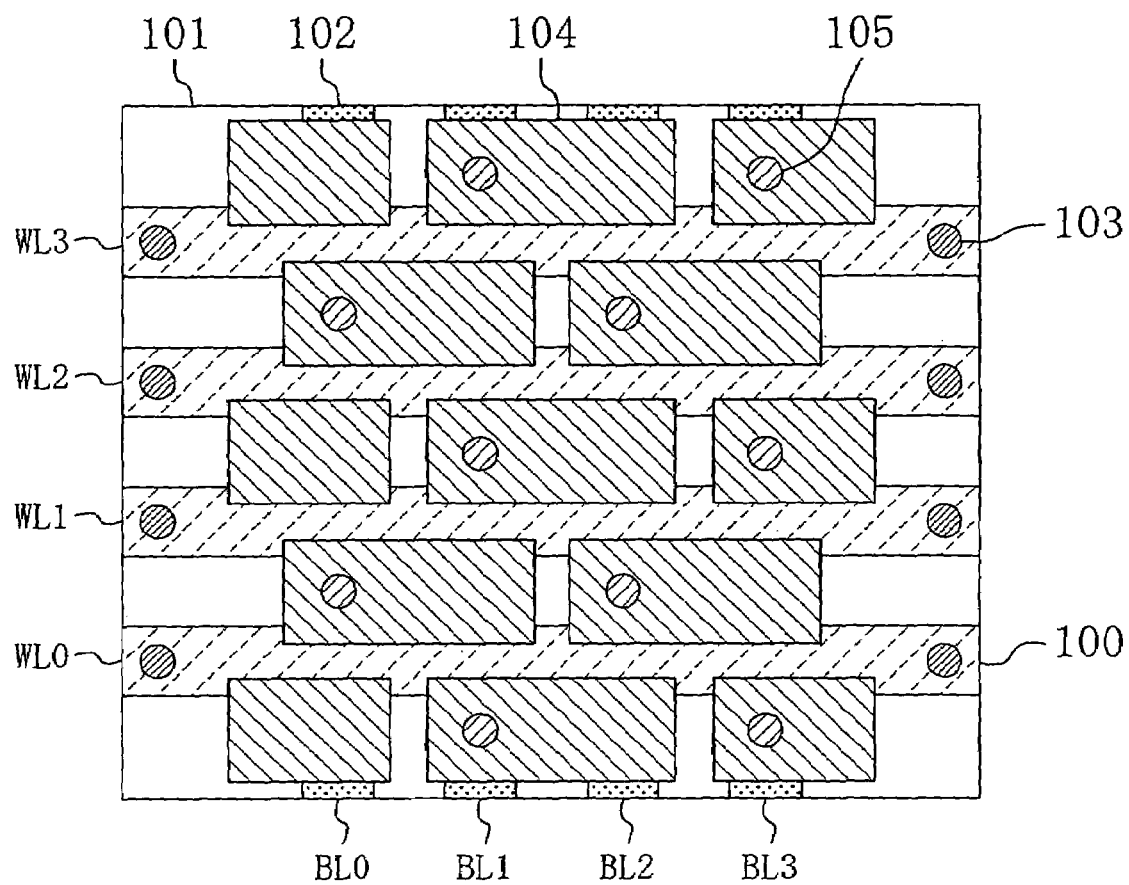
FIG. 3 is a plan view of the memory cell array of the first embodiment and shows the state right after the step of forming first via holes is completed.

FIG. 3 is a plan view of the memory cell array of FIG. 1. FIG. 3 shows the state right after the step of forming first via holes is completed.

As shown in FIG. 3, each first metal wiring 104 connects corresponding two adjacent source/drain diffusion layers 102 of the row direction through corresponding contacts 103 (see FIG. 2). Note that the first metal wiring 104 connects a corresponding single source/drain diffusion layer 102 depending on the position of the first metal wiring 104. First via holes 105 forming bit lines are formed on the first metal wirings 104. Such a first via hole 105 is not formed on the first metal wiring 104 depending on the position of the first metal wiring 104. Metal wirings forming bit lines extend in the column direction perpendicularly to the word line electrodes 100. These metal wirings are not shown in FIG. 3 because they are formed in a step later than the step shown in FIG. 3 (see FIG. 4).

Figure 4:
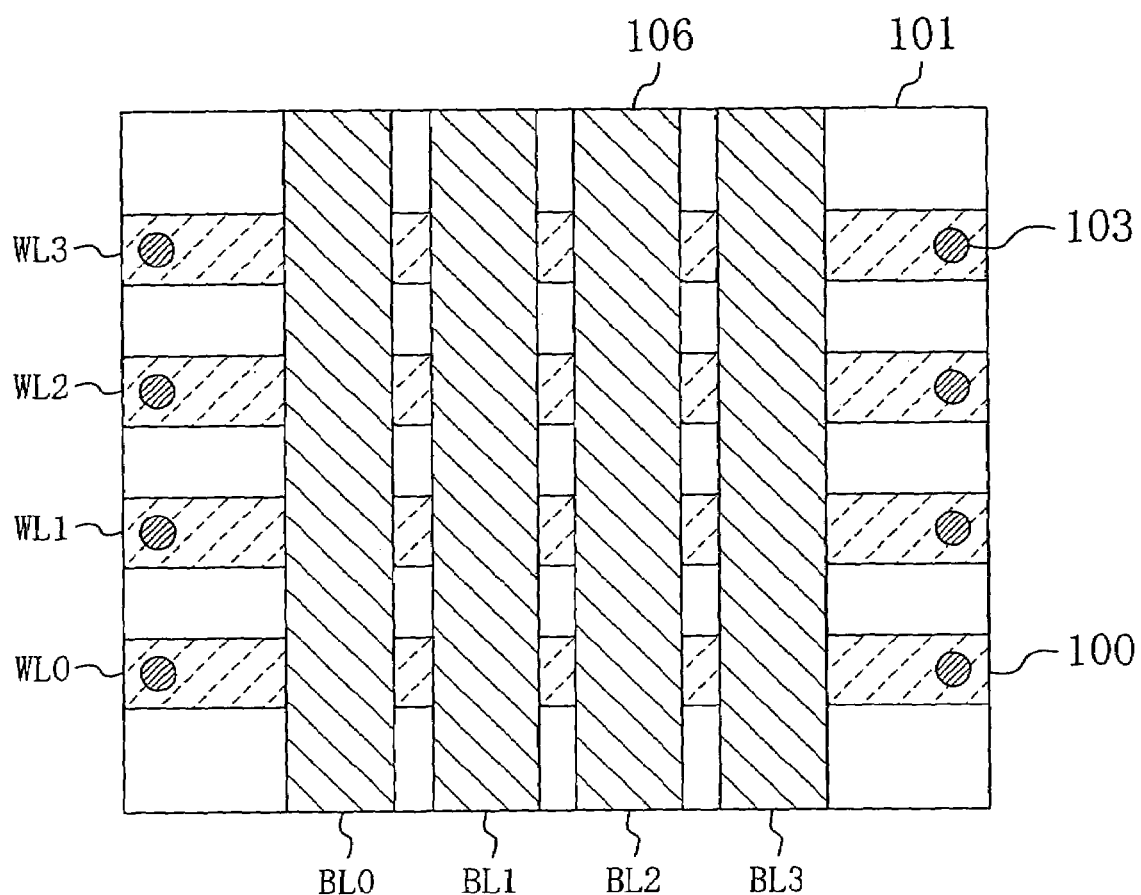
FIG. 4 is a plan view of the memory cell array of the first embodiment and shows the state right after the step of forming second metal wirings is completed.

FIG. 4 is a plan view of the memory cell array of FIG. 1. FIG. 4 shows the state right after the step of forming second metal wirings is completed.

As shown in FIG. 4, second metal wirings 106 extend in the column direction and connect to corresponding first metal wirings 104 through corresponding first via holes 105. The second metal wirings 106 form bit lines.

Figure 5:
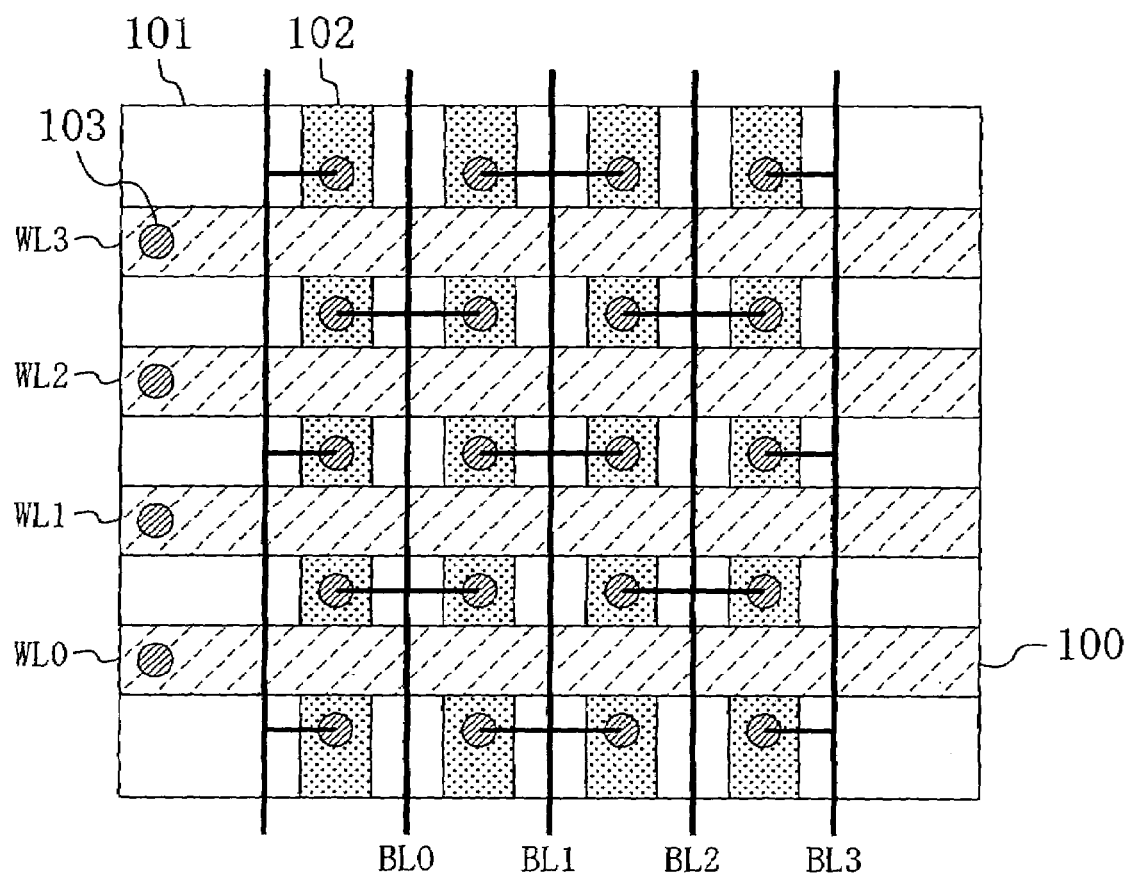
FIG. 5 is a plan view of the memory cell array of the first embodiment and shows electric connection of bit lines.

FIG. 5 schematically shows how the bit lines are electrically connected on the memory cell array.

As can be seen from FIG. 5, two adjacent source/drain diffusion layers 102 in the row direction are electrically connected to each other.

Figure 6:
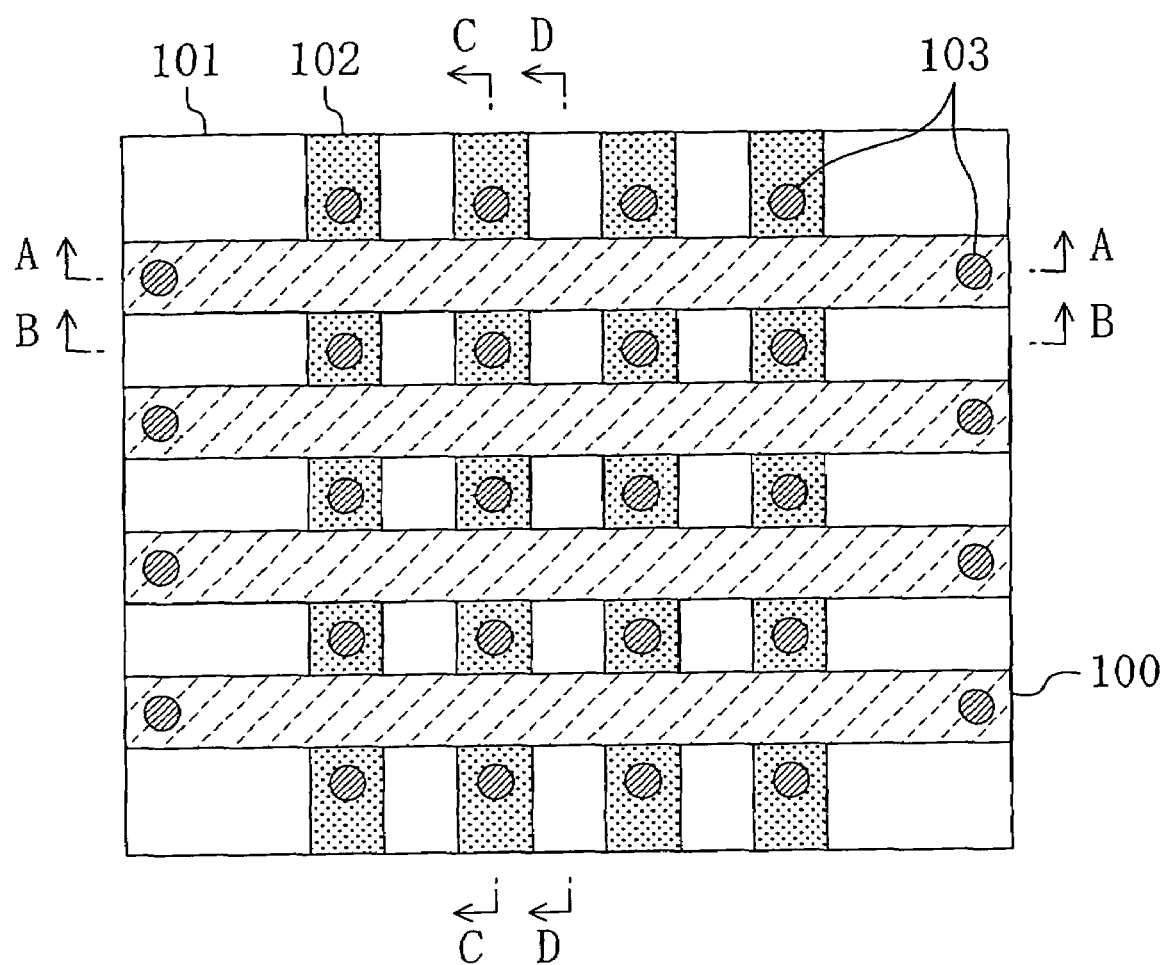
FIG. 6 is a plan view of the memory cell array of the first embodiment and shows cutting lines of the memory cell array.

FIG. 6 is a plan view of the memory cell array showing cutting planes A-A, B-B, C-C and D-D corresponding to the cross-sectional views of FIGS. 7 to 15.

Figure 7:
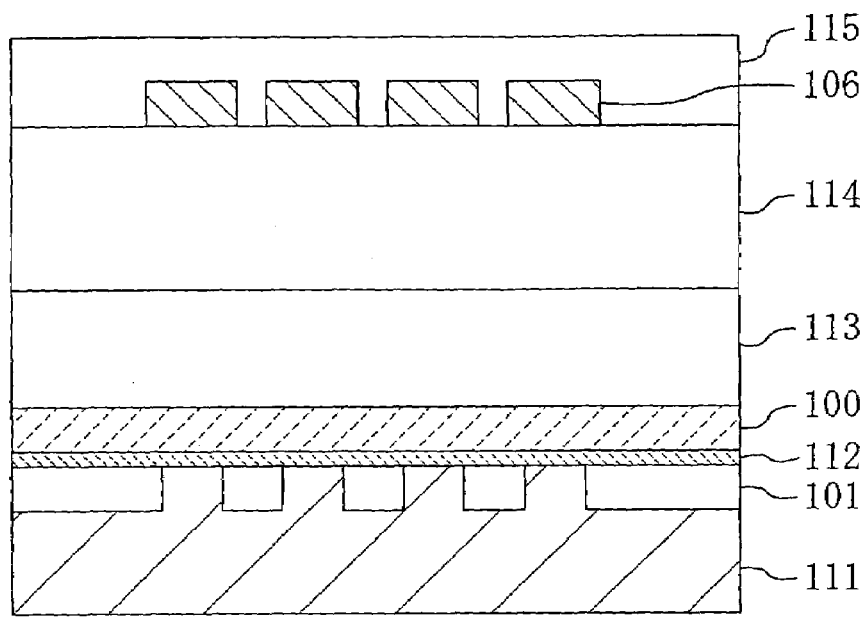
FIG. 7 is a cross-sectional view of the memory cell array of the first embodiment taken along line A-A in FIG. 6.

FIG. 7 is a cross-sectional view of the memory cell array taken along line A-A in FIG. 6.

As shown in FIG. 7, element isolation insulating films 101 are formed in the surface portion of a P-type well 111. A charge trapping layer 112 is formed on the P-type well 111 including the element isolation insulating films 101. For example, the charge trapping layer 112 is formed from a silicon oxide film, a silicon nitride film, a multi-layer film including a silicon oxide film and a silicon nitride film, or the like. A first interlayer insulating film 113 and a second interlayer insulating film 114 are sequentially formed on the charge trapping layer 112. The second metal wirings 106 are formed on the second interlayer insulating film 114. A surface protective film 115 is formed on the second interlayer insulating film 114 so as to cover the second metal wirings 106.

The second metal wirings 106 extend in the column direction and form bit lines (see FIG. 4). The second metal wirings 106 are formed so as to cover the regions of the word line electrodes 100 which are located on the regions of the P-type well 111 surrounded by the element isolation insulating films 101. This structure can shield UV rays which are generated during the manufacturing process and can prevent increase in threshold voltage of memory cells.

Figure 8:
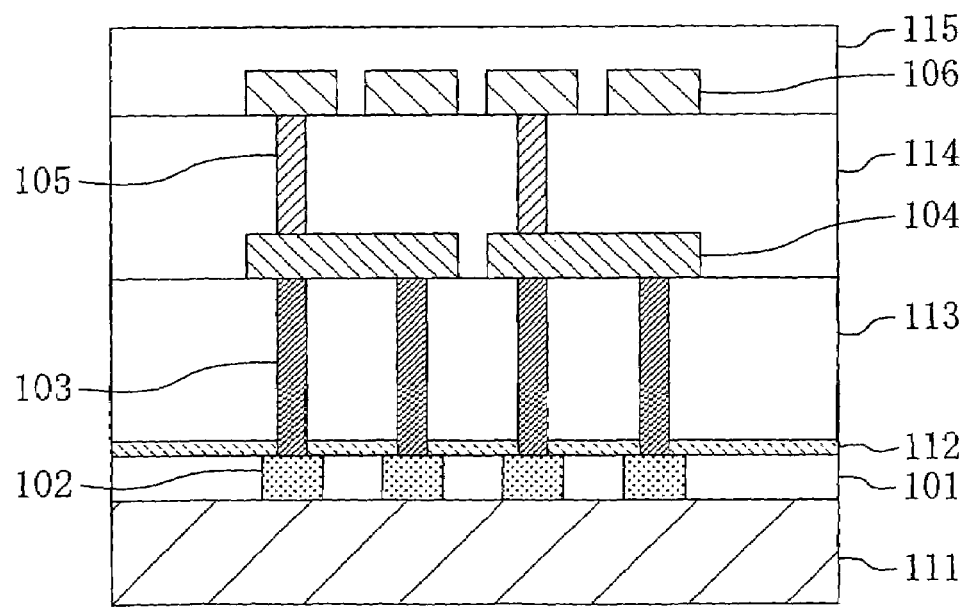
FIG. 8 is a cross-sectional view of the memory cell array of the first embodiment taken along line B-B in FIG. 6.

FIG. 8 is a cross-sectional view of the memory cell array taken along line B-B of FIG. 6.

As shown in FIG. 8, source/drain diffusion layers 102 and element isolation insulating films 101 are alternately formed at the surface of the P-type well 111. Adjacent source/drain diffusion layers 102 are electrically isolated from each other by the element isolation insulating films 101 and the P-type well 111. The charge trapping layer 112 is formed on the element isolation insulating films 101 and the source/drain diffusion layers 102. The first interlayer insulating film 113 is formed on the charge trapping layer 112. Contacts 103 are formed in the first interlayer insulating film 113. The contacts 103 extend through the first interlayer insulating film 113 and the charge trapping layer 112, and the bottom ends of the contacts 103 contact corresponding source/drain diffusion layers 102. First metal wirings 104 are formed on the first interlayer insulating film 113. Each first metal wiring 104 connects to the top ends of corresponding two contacts 103. The second interlayer insulating film 114 covers the first metal wirings 104. A first via hole 105 is formed for each first metal wiring 104. Each first via hole 105 extends through the second interlayer insulating film 114 and has its bottom end connecting to the top surface of a corresponding first metal wiring 104.

The first metal wirings 104 are formed at such positions that cover the source/drain diffusion layers 102. This structure can shield UV rays which are generated during the manufacturing process and can prevent increase in threshold voltage of memory cells.

Figure 9:
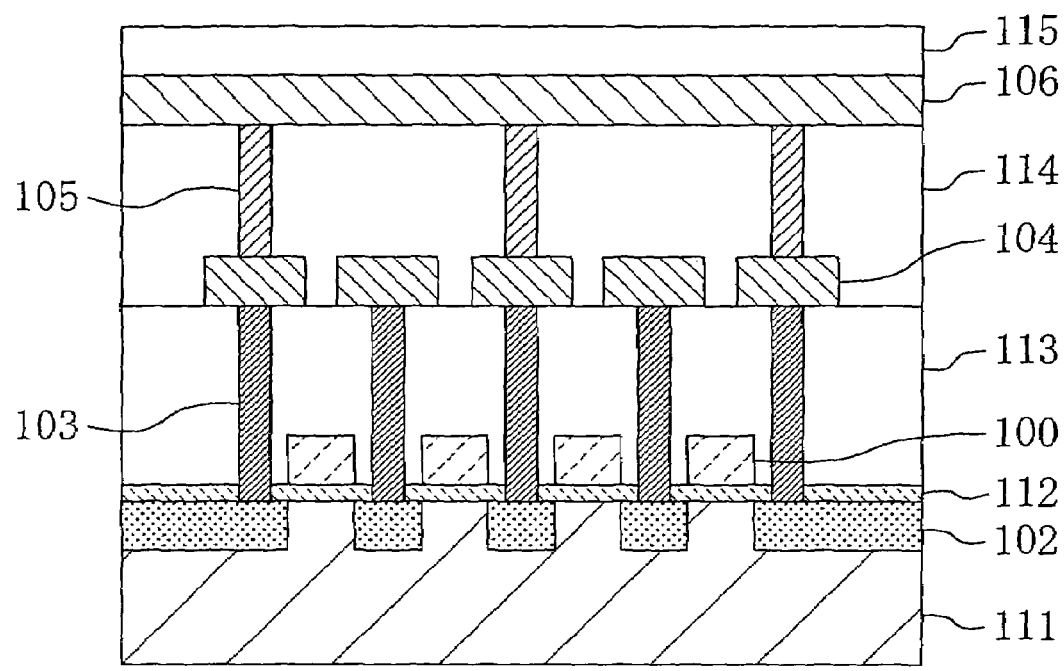
FIG. 9 is a cross-sectional view of the memory cell array of the first embodiment taken along line C-C in FIG. 6.

FIG. 9 is a cross-sectional view of the memory cell array taken along line C-C in FIG. 6.

As shown in FIG. 9, source/drain diffusion layers 102 are formed in the surface portion of the P-type well 111. The charge trapping layer 112 is formed on the P-type well 111 including the source/drain diffusion layers 102. The word line electrodes 100 are formed on the charge trapping layer 112 at positions corresponding to the portions of the P-type well 111 which are surrounded by the source/drain diffusion layers 102. The first interlayer insulating film 113 is formed on the charge trapping layer 112 so as to cover the word line electrodes 100. Contacts 103 are formed in the first interlayer insulating film 113. Each contact 113 extends through the first interlayer insulating film 113 and the charge trapping layer 112 and has its bottom end connecting to a corresponding source/drain diffusion layer 102. First metal wirings 104 are formed on the first interlayer insulating film 113. The bottom surface of each first metal wiring 104 connects to the top end of a corresponding contact 103. The second interlayer insulating film 114 is formed on the first interlayer insulating film 113 so as to cover the first metal wirings 104. First via holes 105 are formed in the second interlayer insulating film 114. Each first via hole 105 extends through the second interlayer insulating film 114 and has its bottom end connecting to the top surface of every other first metal wiring 104. A second metal wiring 106 and the surface protective film 115 are sequentially formed on the second interlayer insulating film 114 and the first via holes 105. Each second metal wiring 106 forming a bit line is electrically connected to every other source/drain diffusion layer 102.

The first metal wirings 104 are formed at such positions that cover the source/drain diffusion layers 102. This structure can shield UV rays which are generated during the manufacturing process and can prevent increase in threshold voltage of memory cells.

When sidewalls (not shown) of a UV-absorptive or reflective material are formed on the sidewalls of the word line electrodes 100, the first metal wirings 104 can be formed so as to cover at least the ends of the sidewalls which face the respective source/drain diffusion layers 102. This structure can also shield UV rays which are generated during the manufacturing process and can prevent increase in threshold voltage of memory cells.

Figure 10:
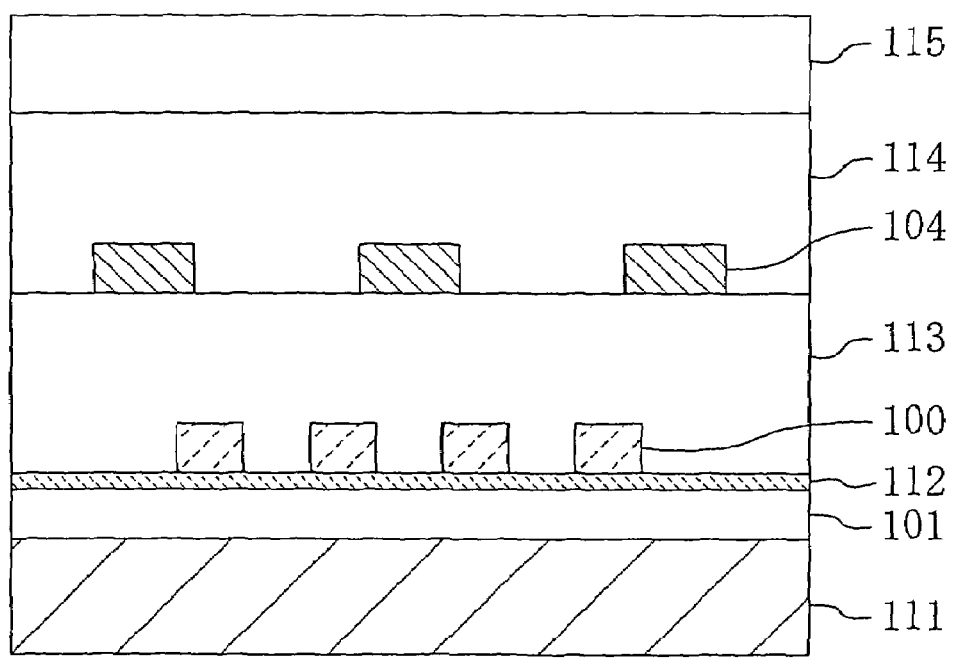
FIG. 10 is a cross-sectional view of the memory cell array of the first embodiment taken along line D-D in FIG. 6.

FIG. 10 is a cross-sectional view of the memory cell array taken along line D-D in FIG. 6.

As shown in FIG. 10, the isolation insulating film 101 is formed on the entire surface of the P-type well 111. The charge trapping layer 112 is formed on the isolation insulating film 101. The word line electrodes 100 are formed on the charge trapping layer 112. The first interlayer insulating film 113 is formed on the charge trapping layer 112 so as to cover the word line electrodes 100. First metal wirings 104 are formed on the first interlayer insulating film 113. The second interlayer insulating film 114 is formed on the first interlayer insulating film 113 so as to cover the first metal wirings 104. The surface protective film 115 is formed on the second interlayer insulating film 114.

Figure 11A:
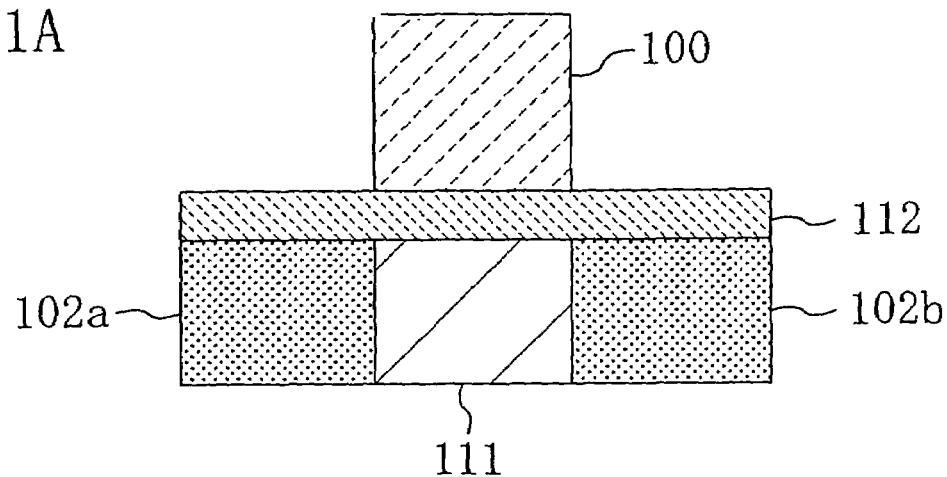
FIG. 11A is a partial enlarged cross-sectional view of the memory cell array of the first embodiment taken along line C-C in FIG. 6.

FIG. 11A is a cross-sectional view (in the gate length direction) of a single memory cell which is formed from the P-type well 111, the source/drain diffusion layers 102, the charge trapping layer 112 and the word line electrode 100 shown in FIG. 9.

As shown in FIG. 11A, a source/drain diffusion layer 102*a* serves as a drain portion, a source/drain diffusion layer 102*b* serves as a source portion, the P-type well 111 serves as a channel portion, the charge trapping layer 112 (non-conductive) serves as a gate insulating film, and the word line electrode 100 serves as a gate electrode. The memory transistor of FIG. 11A thus has the same functions as those of a common MOS transistor. The memory transistor of FIG. 11A is different from a common MOS transistor in that the gate insulating film is formed from the charge trapping layer 112. Note that the source/drain diffusion layers 102*a* and 102*b* are herein respectively referred to as a drain portion and a source portion based on their functions in read operation (see FIG. 12C).

Figure 11B:
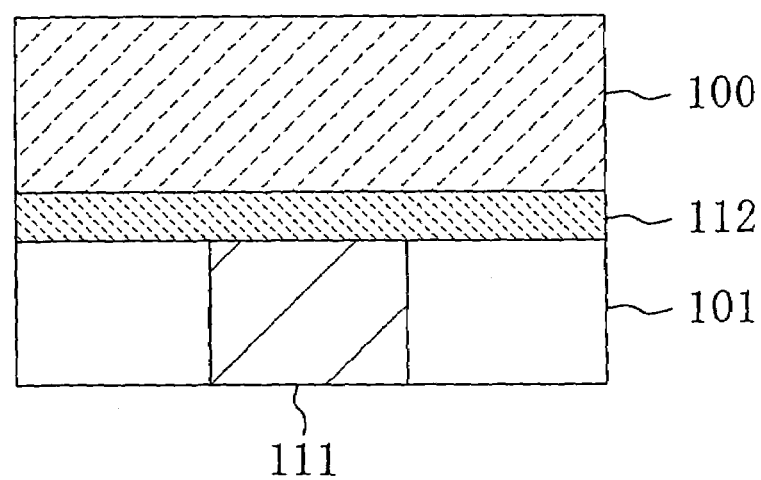
FIG. 11B is a partial enlarged cross-sectional view of the memory cell array of the first embodiment taken along line A-A in FIG. 6.

FIG 11B is a cross-sectional view (in the gate width direction) of a single memory cell which is formed from the P-type well 111, the element isolation insulating films 101, the charge trapping layer 112 and the word line electrode 100 shown in FIG. 7.

As shown in FIG. 11B, the width of the P-type well 111 interposed between the element isolation insulating films 101 corresponds to a gate width.

Hereinafter, basic operation of the memory cell shown in FIGS. 11A and 11B will be described with reference to FIGS. 12A to 12C.

Figure 12A:
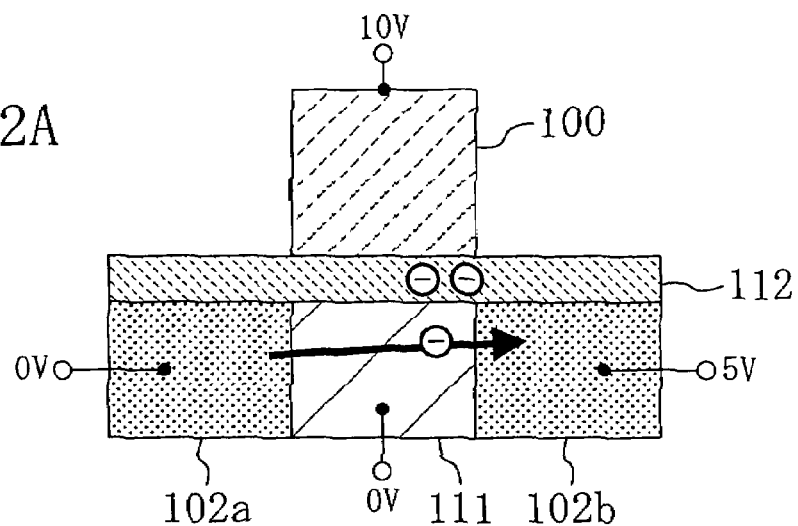
FIG. 12A schematically illustrates write operation of a memory cell in the first embodiment of the present invention, FIG. 12B schematically illustrates erase operation of a memory cell in the first embodiment of the present invention, and FIG. 12C schematically illustrates read operation of a memory cell in the first embodiment of the present invention.

FIG. 12A illustrates write operation of the memory cell. Like FIG. 11A, FIG. 12A is a cross-sectional view of the memory cell in the gate length direction.

As shown in FIG. 12A, a voltage of 10V is applied to the word line electrode 100, 5V is applied to the source/drain diffusion layer 102*b*, 0V is applied to the source/drain diffusion layer 102*a*, and 0V is applied to the P-type well 111. As a result, channel hot electrons are generated in the boundary region between the source/drain diffusion layer 102*b* and the P-type well 111. The electrons thus generated are injected into the charge trapping layer 112. The electrons are locally injected into the region of the charge trapping layer 112 which is located on the boundary region between the source/drain diffusion layer 102b and the P-type well 111.

Figure 12B:
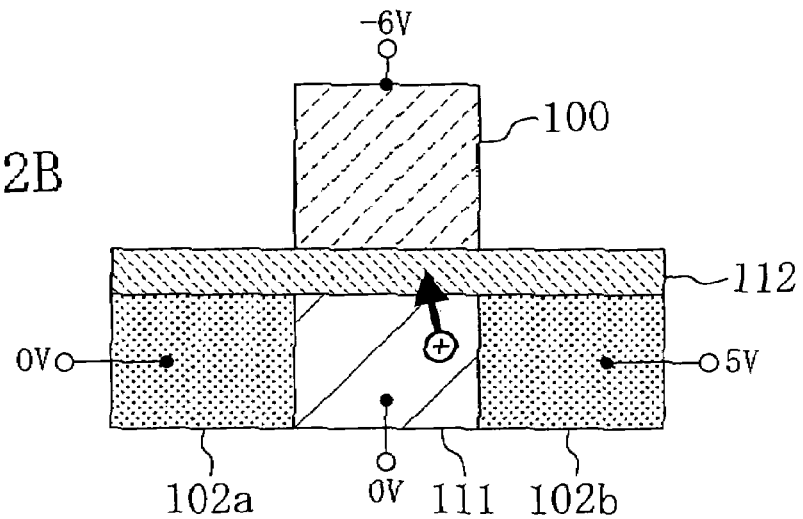

FIG. 12B illustrates erase operation of the memory cell. Like FIG. 11A, FIG. 12B is a cross-sectional view of the memory cell in the gate length direction.

As shown in FIG. 12B, a voltage of −6V is applied to the word line electrode 100, 5V is applied to the source/drain diffusion layer 102b, 0V is applied to the source/drain diffusion layer 102a, and 0V is applied to the P-type well 111. As a result, hot holes are generated in the boundary region between the source/drain diffusion layer 102b and the P-type well 111 due to an interband tunneling current. The holes thus generated are injected into the charge trapping layer 112. Electrons injected in write operation are thus electrically neutralized.

Figure 12C:
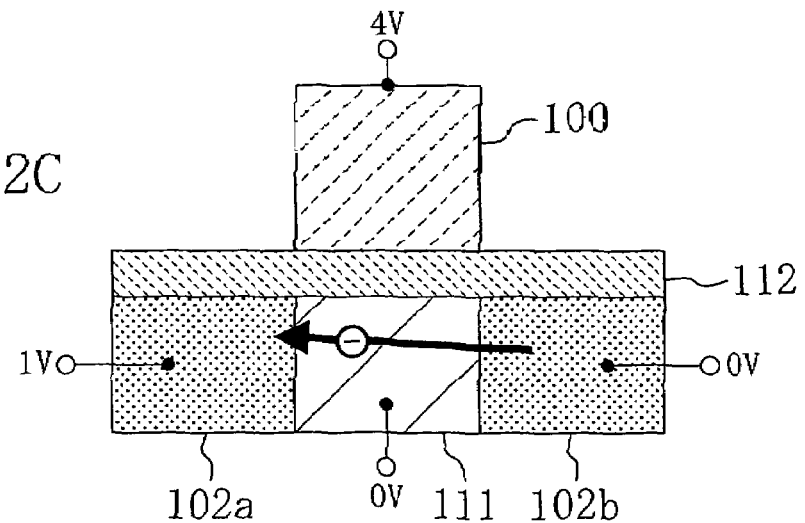

FIG. 12C illustrates read operation of the memory cell. Like FIG. 11A, FIG. 12C is a cross-sectional view of the memory cell in the gate length direction.

As shown in FIG. 12C, a voltage of 4V is applied to the word line electrode 100, 0V is applied to the source/drain diffusion layer 102b, 1V is applied to the source/drain diffusion layer 102a, and 0V is applied to the P-type well 111. When data has been stored in the memory cell, electrons have been trapped in the region of the charge trapping layer 112 which is close to the source/drain diffusion layer 102b. The memory cell therefore has a high threshold voltage, and a source-drain current does not flow in response to the voltage application. On the other hand, when data has been erased from the memory cell, electrons trapped in write operation have been electrically neutralized in the region of the charge trapping layer 112 which is close to the source/drain diffusion layer 102b. The memory cell therefore has a low threshold voltage, and a source-drain current flows in response to the voltage application.

The local-trapping MONOS memory cell is thus characterized in that electrons are locally trapped in the charge trapping layer 112 and in that a source-drain current flows in the opposite directions in read operation and write operation.

Hereinafter, the UV shielding effect obtained by using the first metal wirings 104 and the second metal wirings 106 will be described.

As described above for FIGS. 35 and 36B, the conventional example suppresses increase in threshold voltage of memory cells by forming the UV absorbing layer 5 between the first interlayer insulating film 13 and the first additional interlayer insulating film 14 as shown in FIGS. 28 to 31. However, such a UV absorbing layer 5 can be used because the contacts 4 are formed in the peripheral region of the memory cell array as shown in FIG. 26.

The first embodiment of the present invention uses metal wirings as bit lines. As mentioned earlier, when metal wirings are used as bit lines, contacts 103 must be formed all over the memory cell array as shown in FIG. 2. Therefore, the use of a UV absorbing layer in the structure of the first embodiment is not practical for the following reasons: holes for contacts 103 need to be formed also in the UV absorbing layer; and the UV absorbing layer must be formed from a material capable of suppressing a leakage current through the UV absorbing layer to approximately zero (about 0.1 μA or less between bit lines).

In view of the above problems, the first embodiment of the present invention uses the first metal wirings 104 and the second metal wirings 106 in order to prevent increase in threshold voltage of memory cells due to UV rays which are generated during the manufacturing process.

Figure 26:
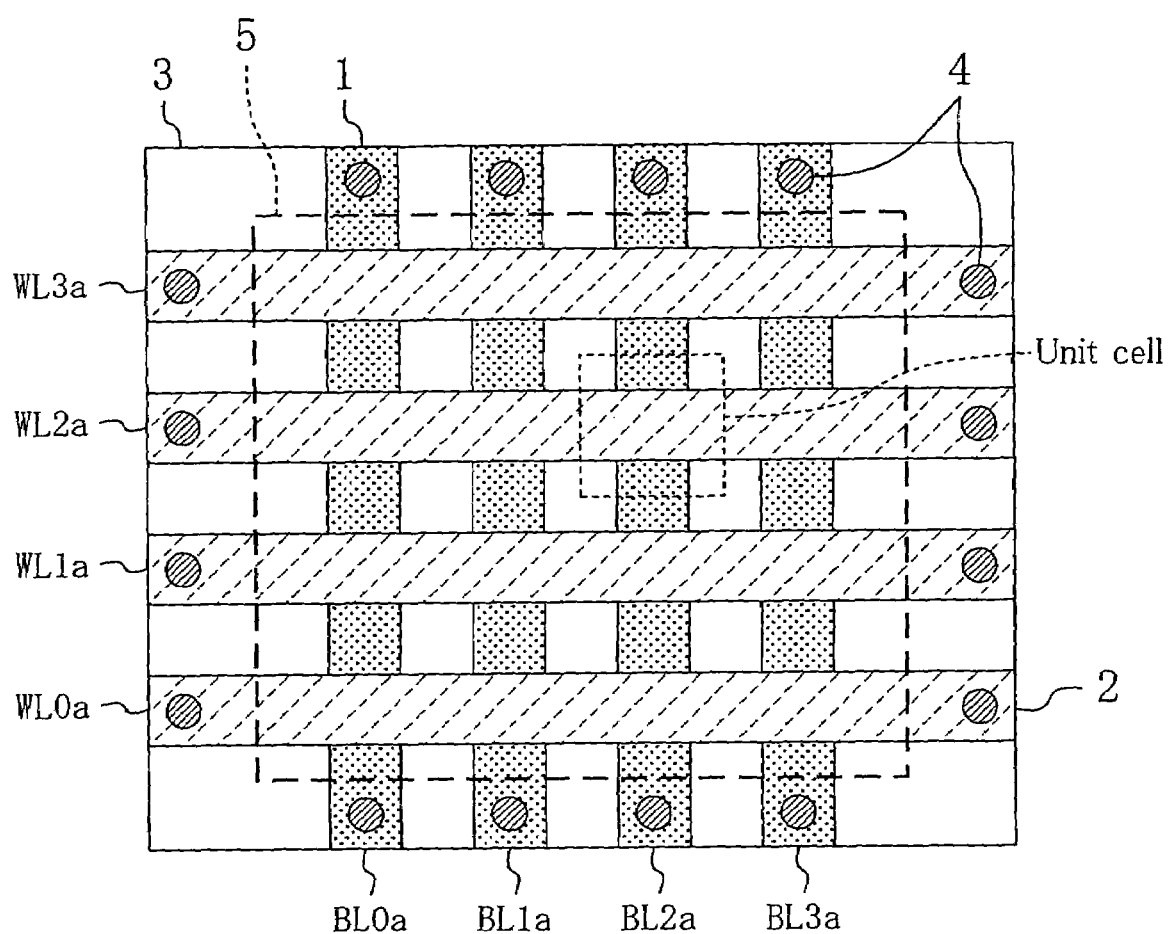
FIG. 26 is a plan view of a memory cell array in a conventional example.
Figure 27:
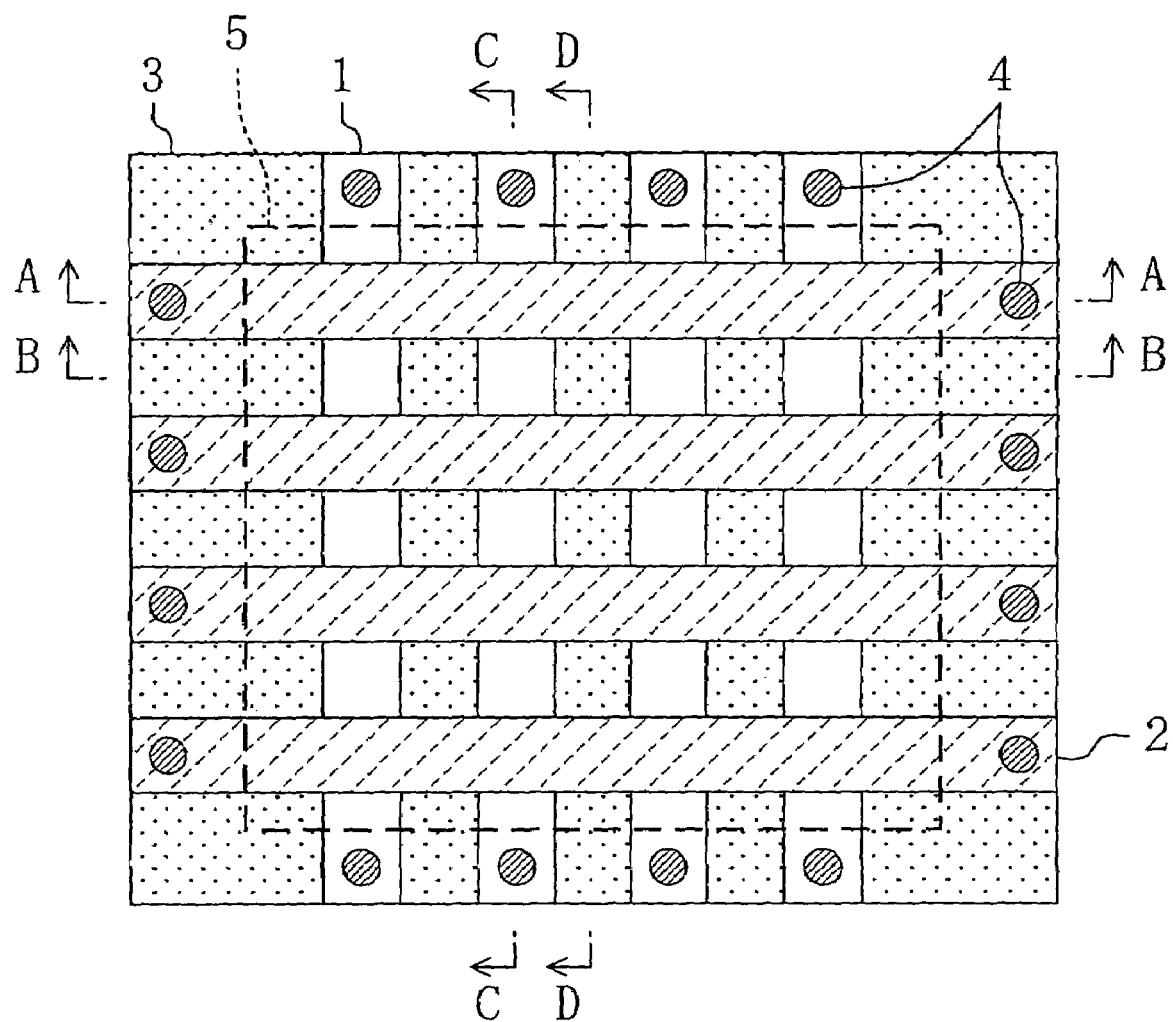
FIG. 27 is a plan view of the memory cell array in the conventional example and shows cutting planes of the memory cell array.
Figure 28:
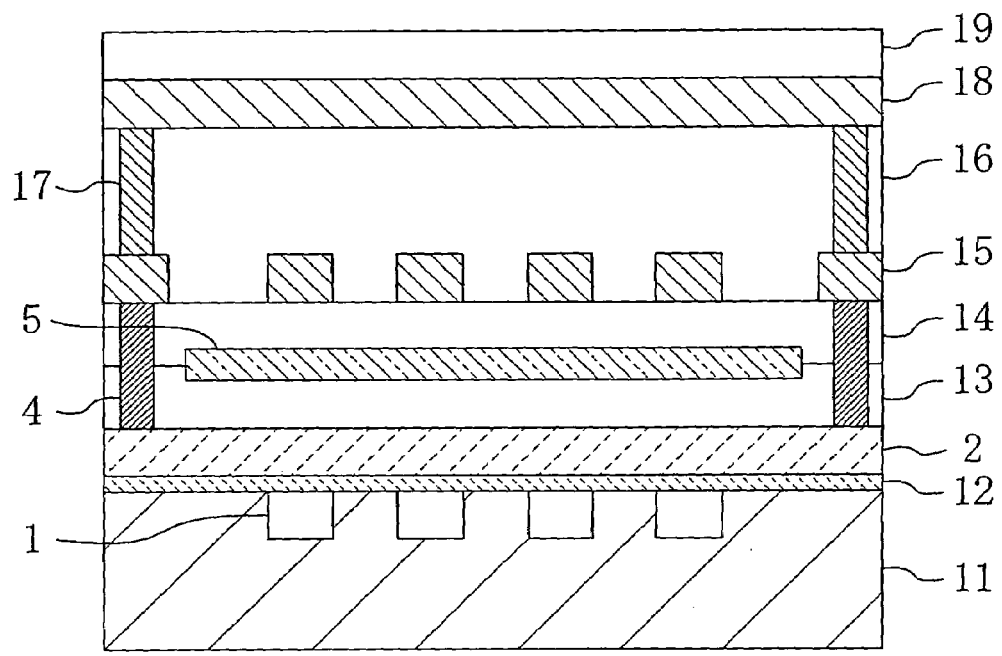
FIG. 28 is a cross-sectional view of the memory cell array in the conventional example taken along line A-A in FIG. 27.
Figure 29:
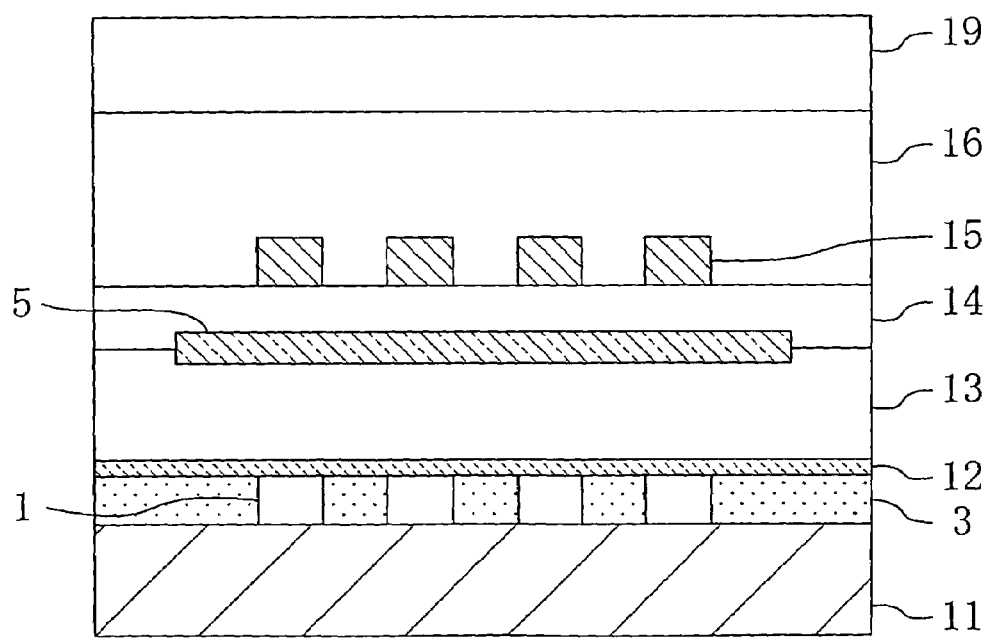
FIG. 29 is a cross-sectional view of the memory cell array in the conventional example taken along line B-B in FIG. 27.
Figure 30:
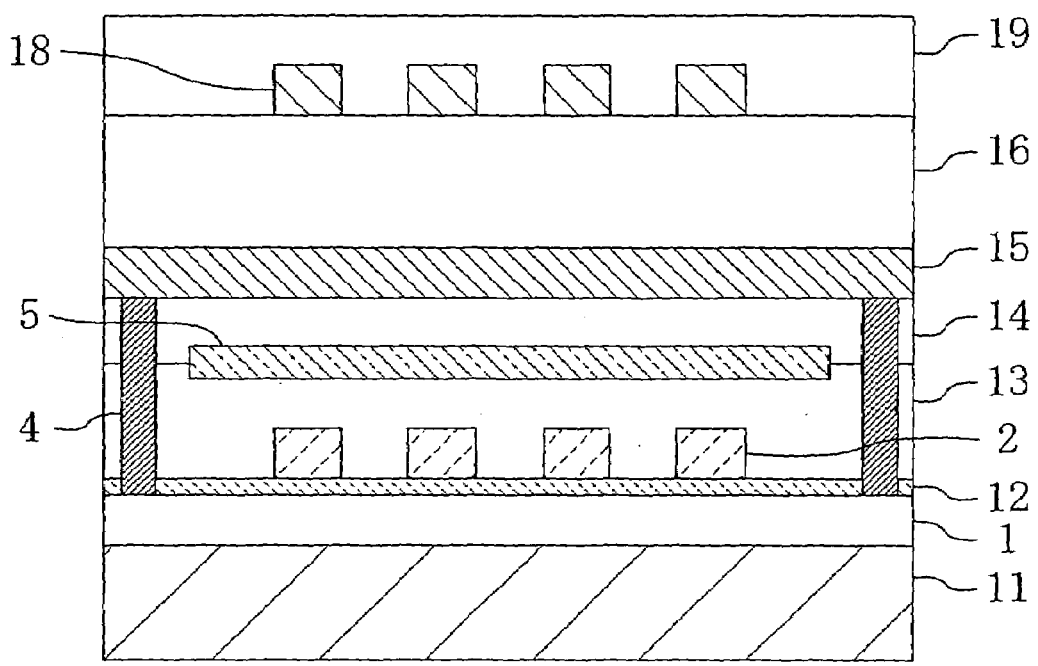
FIG. 30 is a cross-sectional view of the memory cell array in the conventional example taken along line C-C in FIG. 27.
Figure 31:
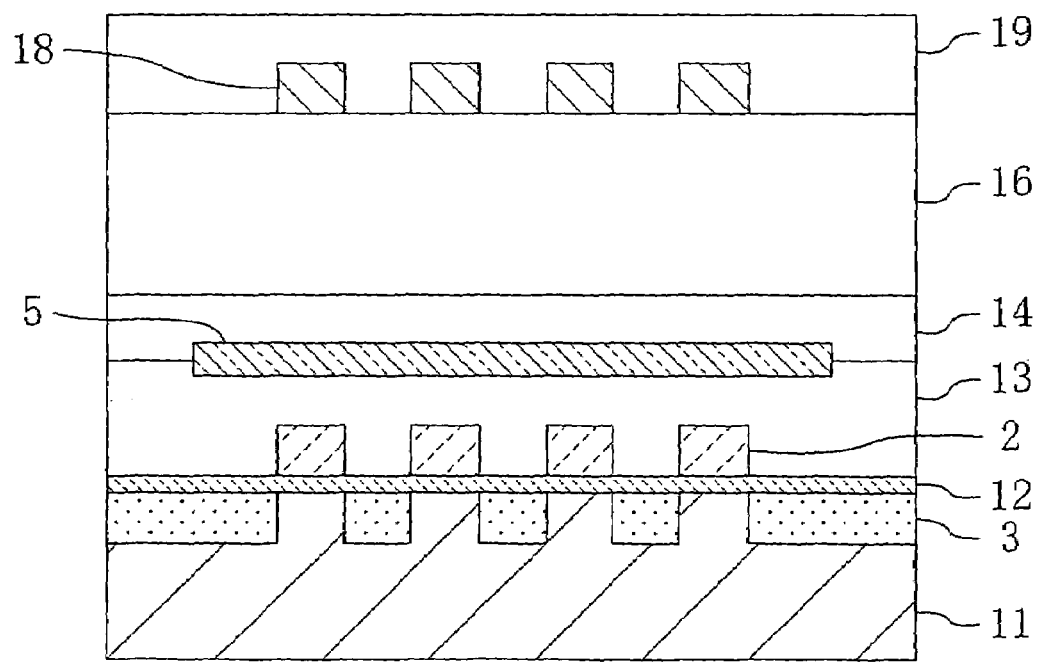
FIG. 31 is a cross-sectional view of the memory cell array in the conventional example taken along line D-D in FIG. 27.
Figure 32A:
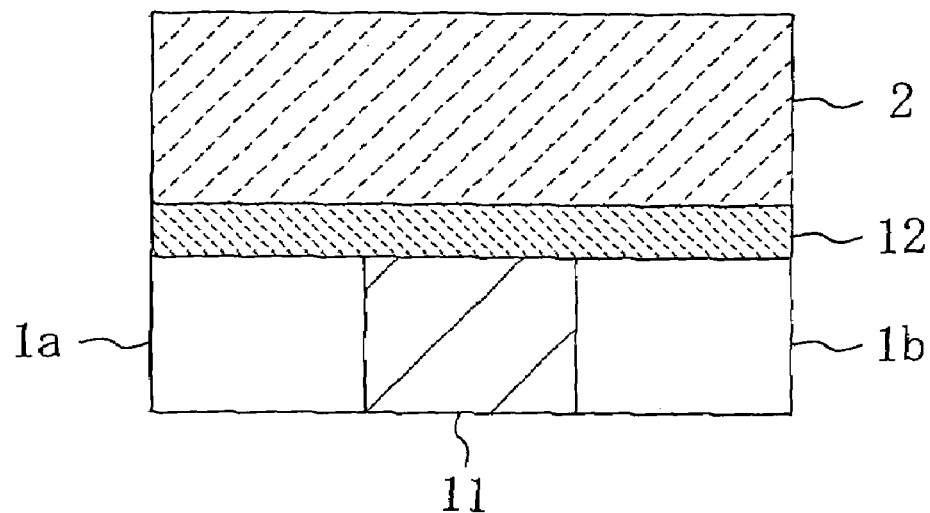
FIG. 32A is a partial enlarged cross-sectional view of the memory cell array in the conventional example taken along line A-A of FIG. 27.
Figure 32B:
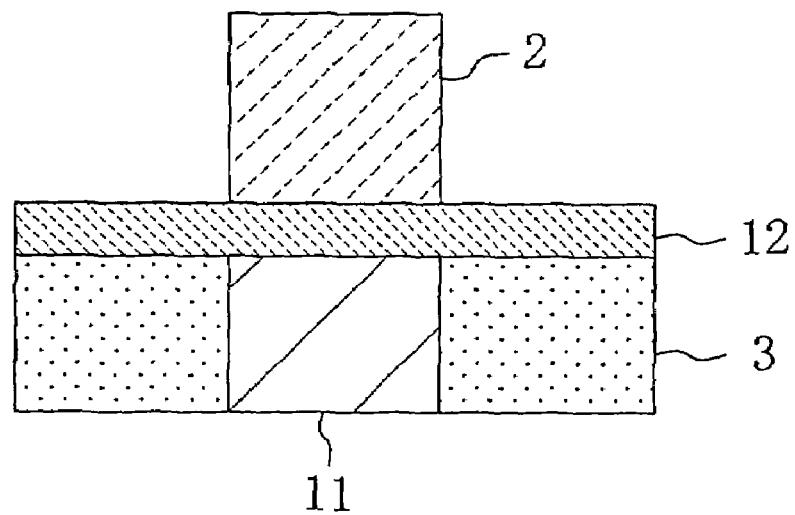
FIG. 32B is a partial enlarged cross-sectional view of the memory cell array in the conventional example taken along line D-D of FIG. 27.
Figure 33A:
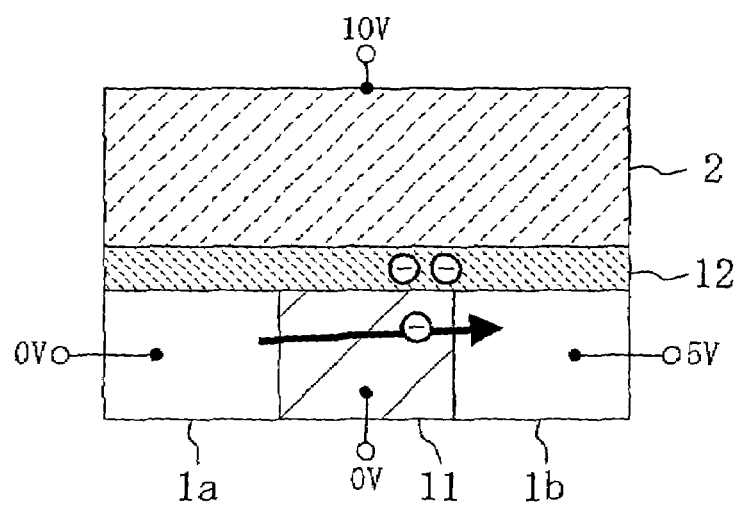
FIG. 33A schematically illustrates write operation of a memory cell in the conventional example, FIG. 33B schematically illustrates erase operation of a memory cell in the conventional example, and FIG. 33C schematically illustrates read operation of a memory cell in the conventional example.
Figure 33B:
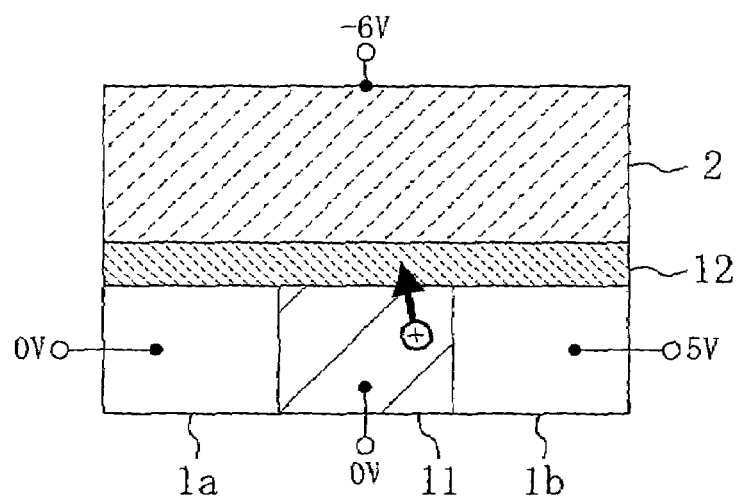
Figure 33C:
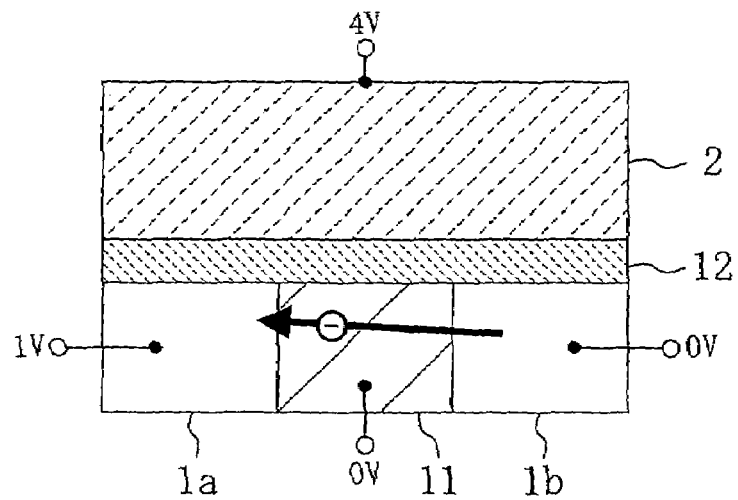
Figure 34:
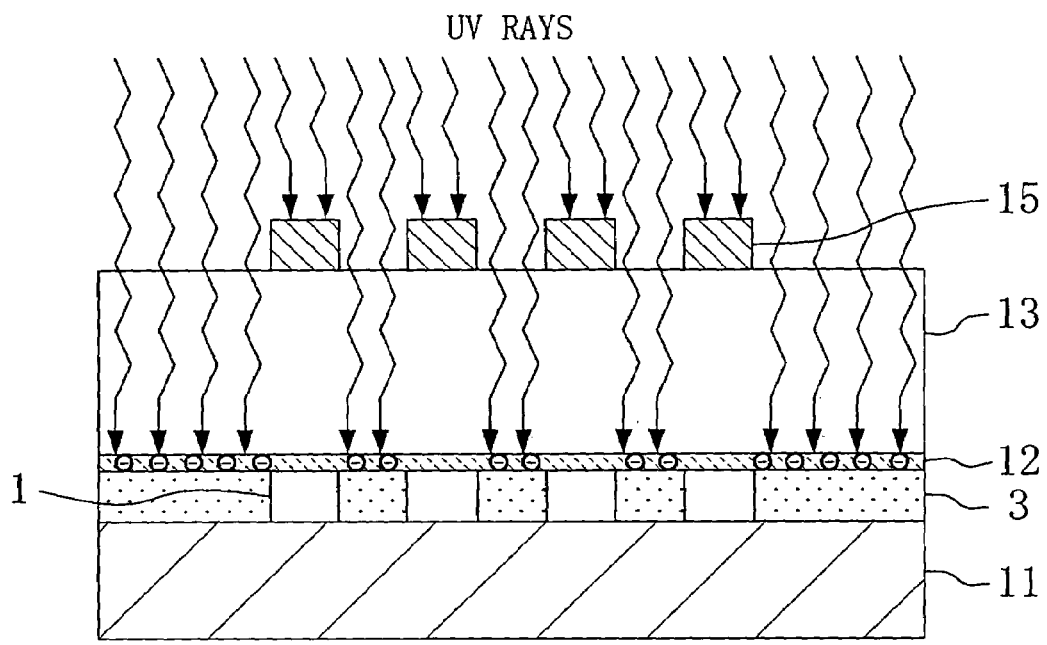
FIG. 34 schematically illustrates UV radiation in a cross section of the memory cell array of the conventional example taken along line B-B in FIG. 27.
Figure 35:
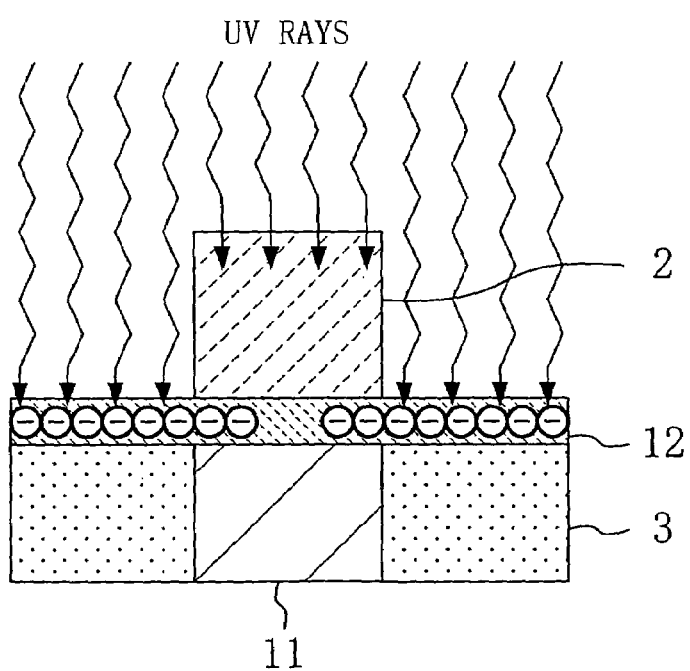
FIG. 35 schematically illustrates UV radiation in a cross section of the memory cell array of the conventional example taken along line D-D in FIG. 27.
Figure 36A:
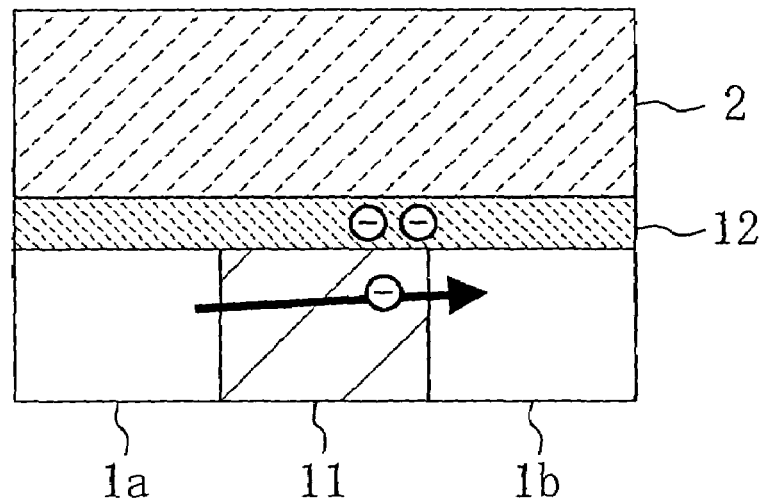
FIG. 36A is an enlarged cross-sectional view of a central portion of the gate in the memory cell array of the conventional example taken along line A-A in FIG. 27.
Figure 36B:
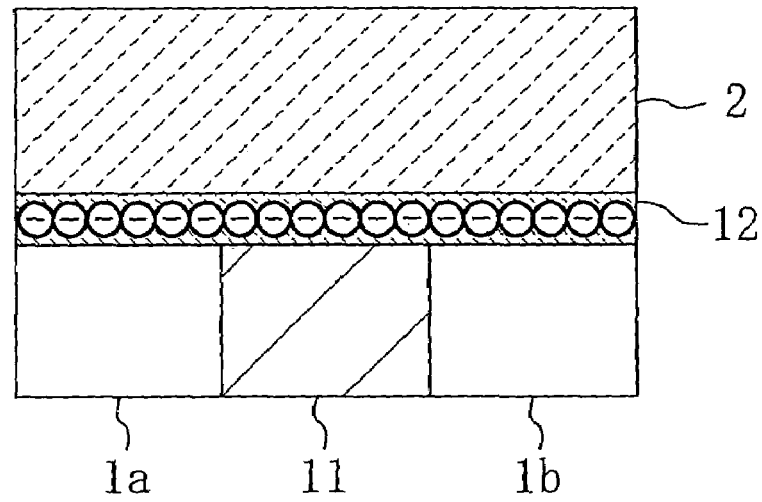
FIG. 36B is an enlarged cross-sectional view of an edge portion of the gate in the memory cell array of the conventional example taken along line D-D in FIG. 27.

As shown in FIGS. 26, 34 and 35, when UV rays impinge on the isolation diffusion layers 3 in the conventional example, electrons are trapped not only in the regions of the charge trapping layer 12 which are located on the isolation diffusion layers 3 but also in the regions of the charge trapping layer 12 which are located under both ends of the word line electrode 2 which face the isolation diffusion layers 3 (see FIG. 35). As a result, the threshold voltage of memory cells is increased. By preventing UV rays from impinging on the source/drain diffusion layers 102 of FIG. 2, the first embodiment of the present invention prevents increase in threshold voltage of memory cells due to UV rays which are generated during the manufacturing process.

More specifically, as shown in FIG. 3, each first metal wiring 104 covers corresponding source/drain diffusion layers 102. This structure prevents UV rays which are generated in any step after formation of the first metal wirings 104 from impinging on the source/drain diffusion layers 102. This structure will be described in detail with reference to FIGS. 13 to 15.

Figure 13:
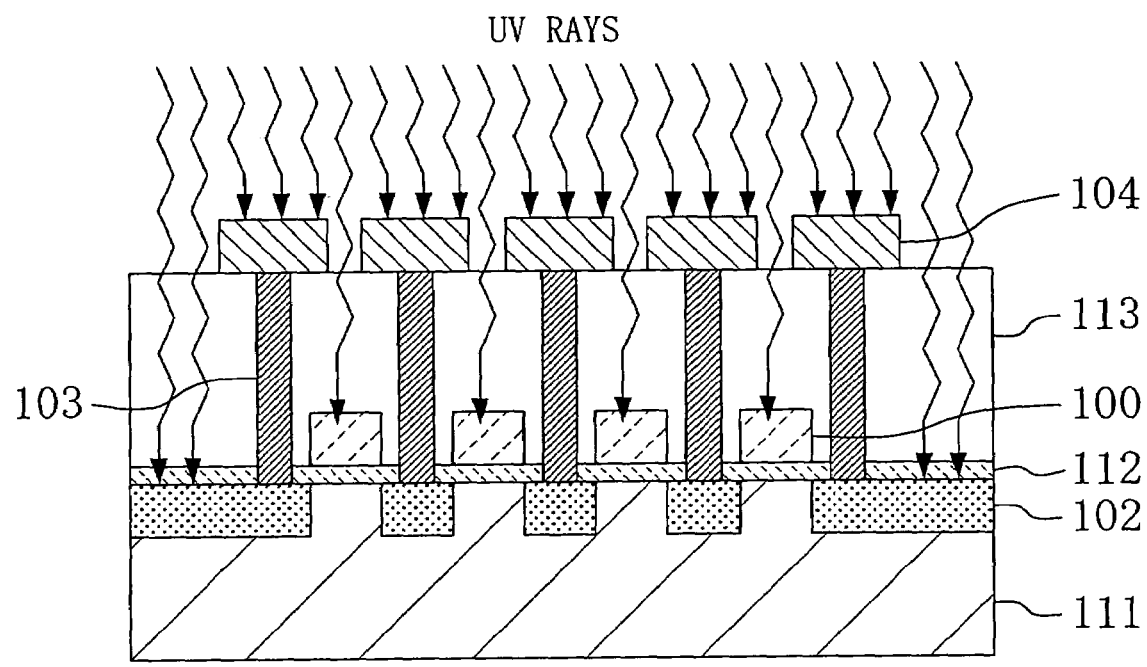
FIG. 13 schematically shows ultraviolet (UV) radiation in a cross section of the memory cell array of the first embodiment taken along line C-C in FIG. 6.

Like FIG. 9, FIG. 13 is a cross-sectional view of the memory cell array taken along line C-C in FIG. 6. In order to describe shielding of UV rays, FIG. 13 shows the state right after the step of forming the first metal wirings 104 is completed.

As can be seen from FIG. 13, the first metal wirings 104 shield UV rays which are generated in any step after formation of the first metal wirings 104. The first metal wirings 104 thus prevent such UV rays from reaching the source/drain diffusion layers 102. As a result, electrons can be prevented from being trapped in the charge trapping layer 112, whereby increase in threshold voltage of memory cells can be suppressed.

Figure 14:
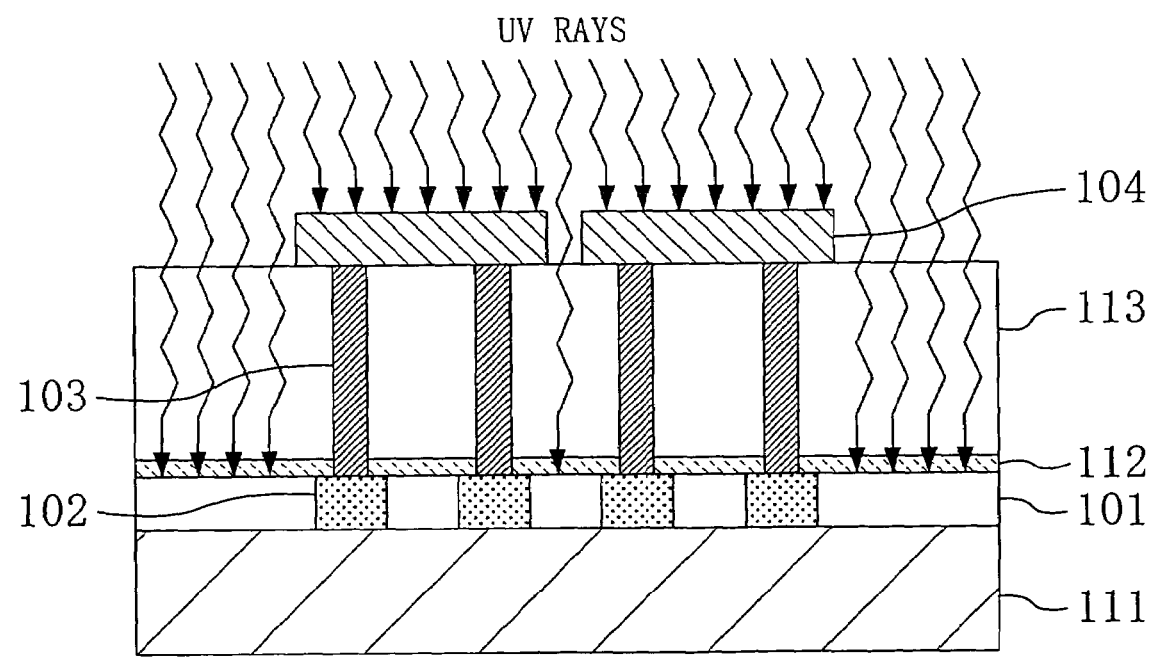
FIG. 14 schematically shows UV radiation in a cross section of the memory cell array of the first embodiment taken along line B-B in FIG. 6.

Like FIG. 8, FIG. 14 is a cross-sectional view of the memory cell array taken along line B-B in FIG. 6. In order to describe shielding of UV rays, FIG. 14 shows the state right after the step of forming the first metal wirings 104 is completed.

As can be seen from FIG. 14, the first metal wirings 104 shield UV rays which are generated in any step after formation of the first metal wirings 104. The first metal wirings 104 thus prevent such UV rays from reaching the source/drain diffusion layers 102. As a result, electrons can be prevented from being trapped in the charge trapping layer 112, whereby increase in threshold voltage of memory cells can be suppressed.

The word line electrodes 100 which are formed from polysilicon or the like are capable of absorbing UV rays. Therefore, UV rays may impinge on the word line electrodes 100. However, a part of UV rays is reflected from the word line electrodes 100 and may possibly be directed onto the source/drain diffusion layers 102. In view of this, as shown in FIG. 4, the second metal wirings 106 are formed to cover the regions (channel formation regions) of the word line electrodes 100 which are interposed between the source/drain diffusion layers 102.

Figure 15:
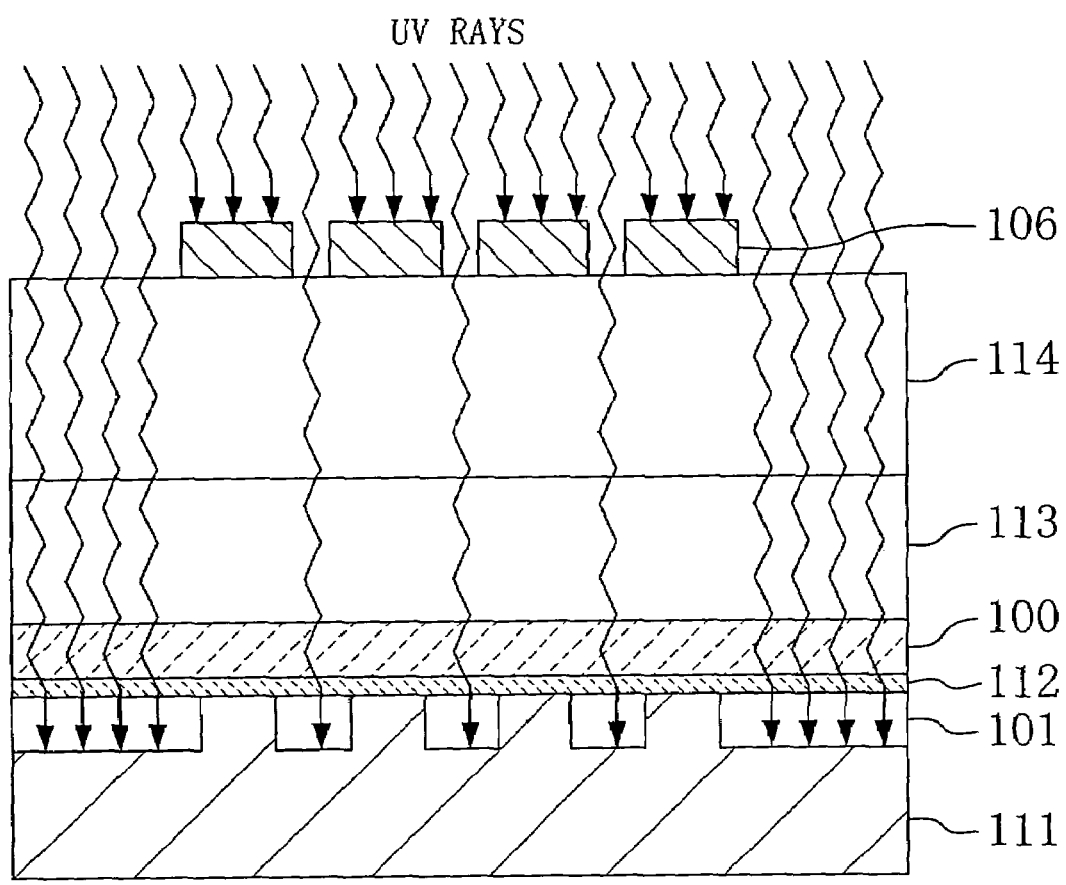
FIG. 15 schematically shows UV radiation in a cross section of the memory cell array of the first embodiment taken along line A-A in FIG. 6.

Like FIG. 7, FIG. 15 is a cross-sectional view of the memory cell array taken along line A-A in FIG. 6. In order to describe shielding of UV rays, FIG. 15 shows the state right after the step of forming the second metal wirings 106 is completed.

As can be seen from FIG. 15, the second metal wirings 106 prevent at least UV rays which are generated in any step after formation of the second metal wirings 106 from directly impinging on the word line electrodes 100, and prevent such UV rays from being partially reflected from the word line electrodes 100 onto the source/drain diffusion layers 102.

Note that when memory cells have a wide gate width, the first metal wirings 104 or the second metal wirings 106 need only be formed so as to cover (when viewed two-dimensionally) at least the regions of the word line electrodes 100 which are located on the portions to which a source-drain current is to be applied. The first metal wirings 104 or the second metal wirings 106 need not cover the whole gate width of the memory cells. In other words, the ends of the word line electrodes 100 which face the source/drain diffusion layers 102 need only be covered by the first metal wirings 104 or the second metal wirings 106 when viewed two-dimensionally. This structure can prevent UV rays from impinging on the portions to which a source-drain current is to be applied and therefore can suppress increase in threshold voltage of memory cells.

Second Embodiment

Hereinafter, a semiconductor device according to a second embodiment of the present invention will be described with reference to the drawings.

Since an electric connection method of a memory cell array of the second embodiment is the same as that shown in FIG. 1, description thereof will not be repeated.

Figure 16:
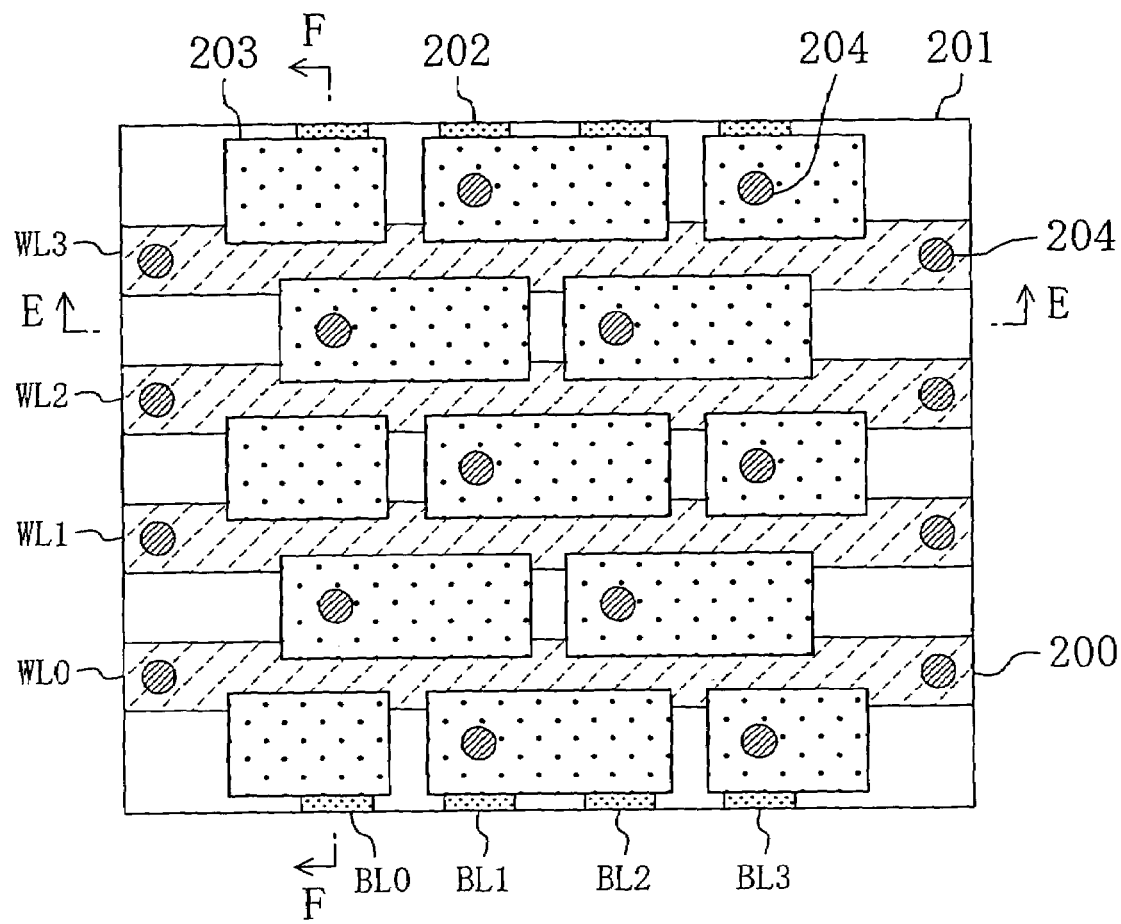
FIG. 16 is a plan view of a memory cell array according to a second embodiment of the present invention and shows the state right after the step of forming contacts is completed.

FIG. 16 is a plan view of the memory cell array of FIG. 1. FIG. 16 shows the state right after the step of forming contacts is completed. FIG. 16 shows cutting planes E-E and F-F corresponding to the cross-sectional views of FIGS. 18A and 18B.

As shown in FIG. 16, word line electrodes 200 forming word lines extend in the row direction and element isolation insulating films 201 extend in the column direction perpendicularly to the word lines. Metal wirings forming bit lines extend in the column direction perpendicularly to the word line electrodes 200. These metal wirings are not shown in FIG. 16 because they are formed in a step later than the step shown in FIG. 16 (see FIG. 17). Source/drain diffusion layers 202 are formed in the regions surrounded by the word line electrodes 200 and the element isolation insulating films 201. Each polysilicon wiring 203 connects corresponding two adjacent source/drain diffusion layers 202 of the row direction. Note that the polysilicon wiring 203 connects a corresponding single source/drain layer 202 depending on the position of the polysilicon wiring 203. Contacts 204 forming bit lines are formed on the polysilicon wirings 203. Such a contact 204 is not formed on the polysilicon wiring 203 depending on the position of the polysilicon wiring 203.

Figure 17:
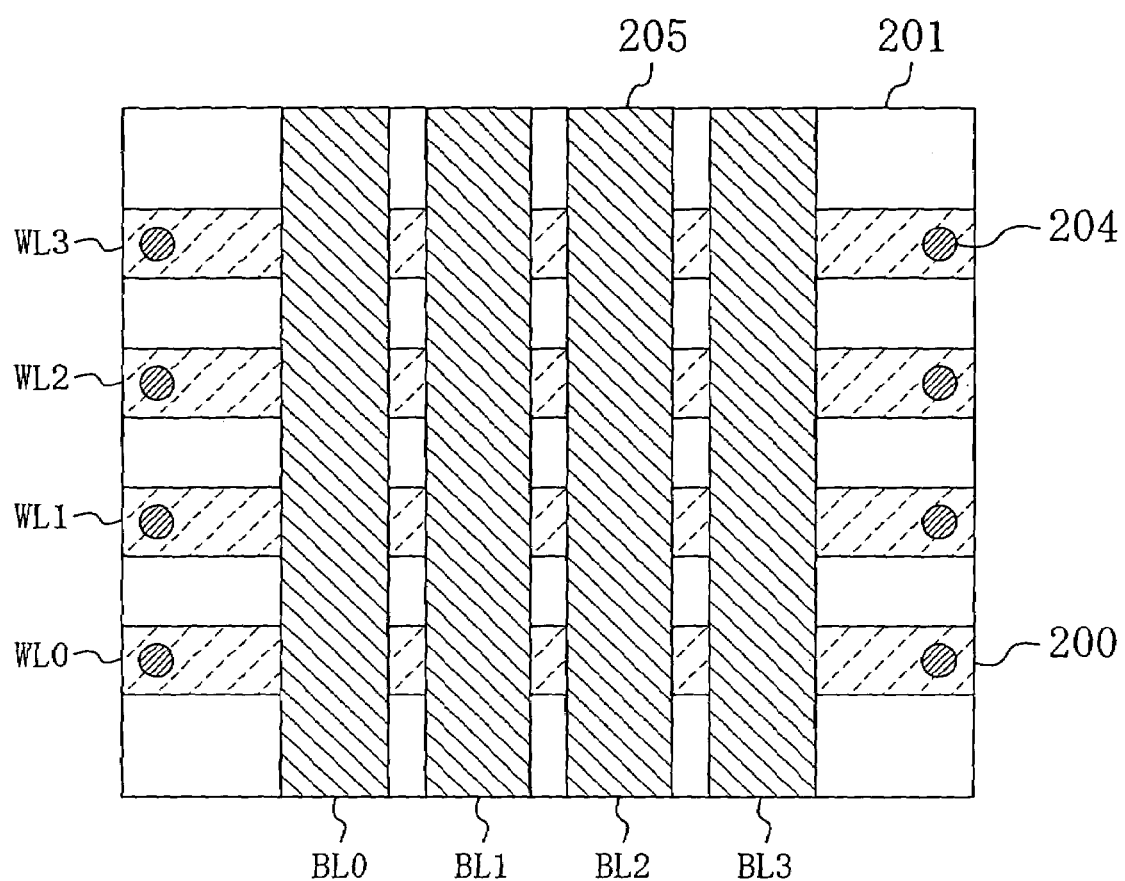
FIG. 17 is a plan view of the memory cell array of the second embodiment and shows the state right after the step of forming first metal wirings is completed.

FIG. 17 is a plan view of the memory cell array of FIG. 1. FIG. 17 shows the state right after the step of forming first metal wirings is completed.

As shown in FIG. 17, first metal wirings 205 extend in the column direction and connect to corresponding polysilicon wirings 203 through corresponding contacts 204. The first metal wirings 205 form bit lines. Note that the bit lines are electrically connected in the same manner as that of the first embodiment, and adjacent two source/drain diffusion layers 202 of the row direction are electrically connected (see FIG. 5).

Figure 18A:
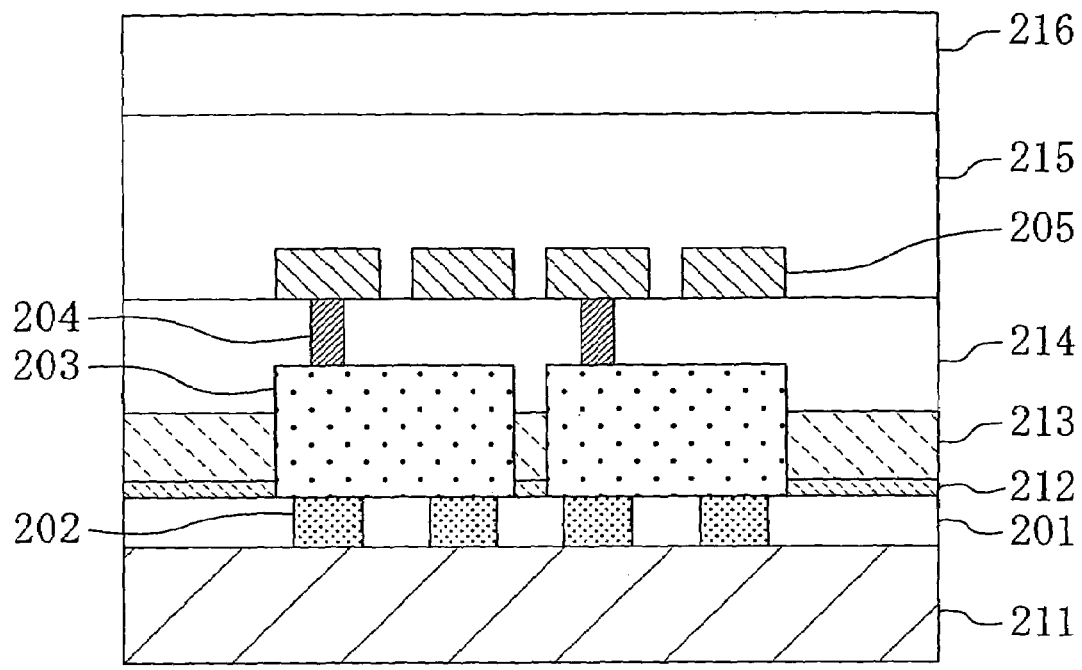
FIG. 18A is a cross-sectional view of the memory cell array of the second embodiment taken along line E-E in FIG. 16.

FIG. 18A is a cross-sectional view of the memory cell array taken along line E-E of FIG. 16.

As shown in FIG. 18A, source/drain diffusion layers 202 and element isolation insulating films 201 are alternately formed at the surface of the P-type well 211. Adjacent source/drain diffusion layers 202 are electrically isolated from each other by the element isolation insulating films 201 and the P-type well 211. A charge trapping layer 212 is formed on the element isolation insulating films 201 and the source/drain diffusion layers 202. The charge trapping layer 212 is formed from a silicon oxide film, a silicon nitride film, a multi-layer film including a silicon oxide film and a silicon nitride film, or the like. A polysilicon pre-growth insulating film 213 (an insulating film which is formed before polysilicon for polysilicon wirings 203 is grown) is formed on the charge trapping layer 212. Polysilicon wirings 203 are formed on the source/drain diffusion layers 202 and the element isolation insulating films 201. Each polysilicon wiring 203 extends through the charge trapping layer 212 and the polysilicon pre-growth insulating film 213 and electrically connects corresponding two adjacent source/drain diffusion layers 202 of the row direction. The polysilicon wirings 203 are formed to entirely cover the source/drain diffusion layers 202. The polysilicon wirings 203 are preferably formed from polysilicon with a thickness of at least 50 nm.

A first interlayer insulating film 214 is formed on the polysilicon wirings 203 and the polysilicon pre-growth insulating film 213. Contacts 204 are formed in the first interlayer insulating film 214. The bottom ends of the contacts 204 respectively contact the top surfaces of the polysilicon wirings 203. First metal wirings 205 are formed on the first interlayer insulating film 214. Every other first metal wiring 205 connects to the top end of a corresponding contact 204. A second interlayer insulating film 215 is formed on the first interlayer insulating film 214 so as to cover the first metal wirings 205. A surface protective film 216 is formed on the second interlayer insulating film 215.

Figure 18B:
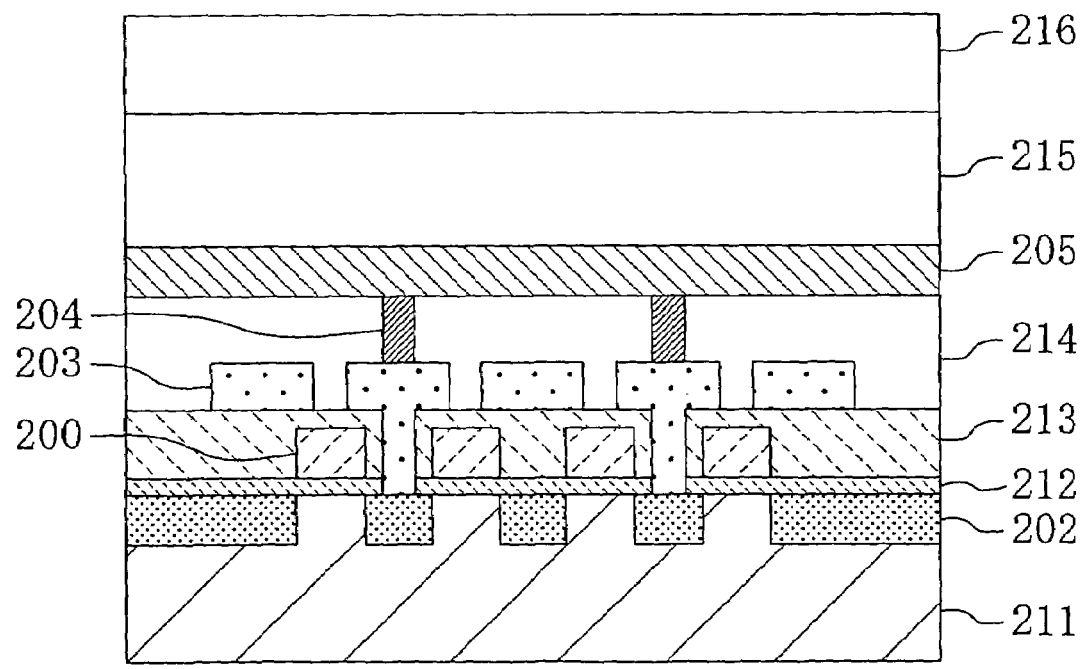
FIG. 18B is a cross-sectional view of the memory cell array of the second embodiment taken along line F-F of FIG. 16.

FIG. 18B is a cross-sectional view of the memory cell array taken along line F-F in FIG. 16.

As shown in FIG. 18B, source/drain diffusion layers 202 are formed in the surface portion of the P-type well 211. The charge trapping layer 212 is formed on the P-type well 211 including the source/drain diffusion layers 202. Word line electrodes 200 are formed on the charge trapping layer 212. More specifically, the word line electrodes 200 are formed above the regions of the P-type well 211 which are surrounded by the source/drain diffusion layers 202. The polysilicon pre-growth insulating film 213 is formed on the charge trapping layer 212 so as to cover the word line electrodes 200. Polysilicon wirings 203 are formed on the polysilicon pre-growth insulating film 213. Every other polysilicon wiring 203 extends through the polysilicon pre-growth insulating film 213 and has its bottom surface contacting a corresponding source/drain diffusion layer 202. The first interlayer insulating film 214 is formed on the polysilicon pre-growth insulating film 213 so as to cover the polysilicon wirings 203. Contacts 204 are formed in the first interlayer insulating film 214. The contacts 204 are formed for every other polysilicon wiring 203, and the bottom end of each contact 204 connects to a corresponding polysilicon wiring 203. A first metal wiring 205 is formed on the first interlayer insulating film 214 and the contacts 204. The second interlayer insulating film 215 and the surface protective film 216 are sequentially formed on the first metal wiring 205.

The polysilicon wirings 203 and the word line electrodes 200 are insulated from each other by the polysilicon pre-growth insulating film 213. The ends of the word line electrodes 200 which face the respective source/drain diffusion layers 202 are covered with the respective polysilicon wirings 203.

The source/drain diffusion layers 202 and the ends of the word line electrodes 200 are thus covered with the polysilicon wirings 203. This structure can prevent UV rays which are generated in any step after formation of the polysilicon wirings 203 from impinging onto the source/drain diffusion layers 202. The first metal wirings 205 cover the source/drain diffusion layers 202 and the word line electrodes 200. This structure can prevent at least UV rays which are generated in any step after formation of the first metal wirings 205 from impinging directly onto the word line electrodes 200 and can prevent such UV rays from being partially reflected from the word line electrodes 200 onto the source/drain diffusion layers 202.

Hereinafter, a method for manufacturing a semiconductor device according to the 10 second embodiment of the present invention will be described with reference to the drawings.

Figure 19A:
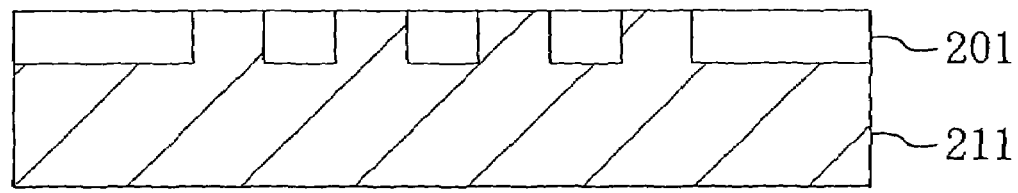
Figure 19B:
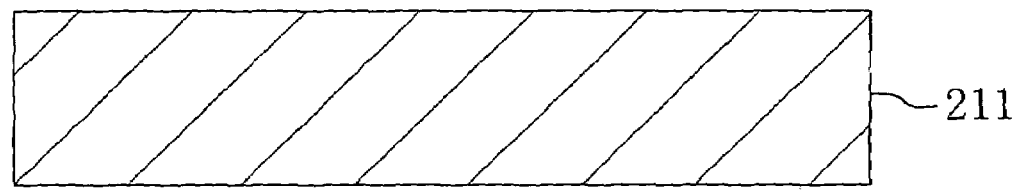

FIGS. 19A and 19B illustrate the manufacturing method of the second embodiment. FIG. 19A is a cross-sectional view of the memory cell array taken along line E-E of FIG. 16 and FIG. 19B is a cross-sectional view of the memory cell array taken along line F-F of FIG. 16.

As shown in FIGS. 19A and 19B, a P-type well 211 is formed on a not-shown semiconductor substrate and element isolation insulating films 201 for defining element formation regions is formed in the surface potion of the P-type well 211.

Figure 20A:
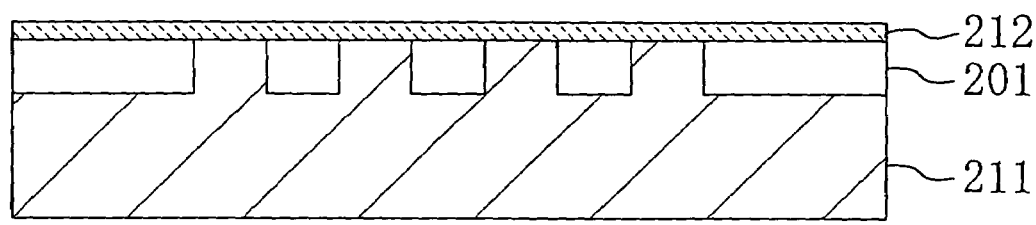
Figure 20B:
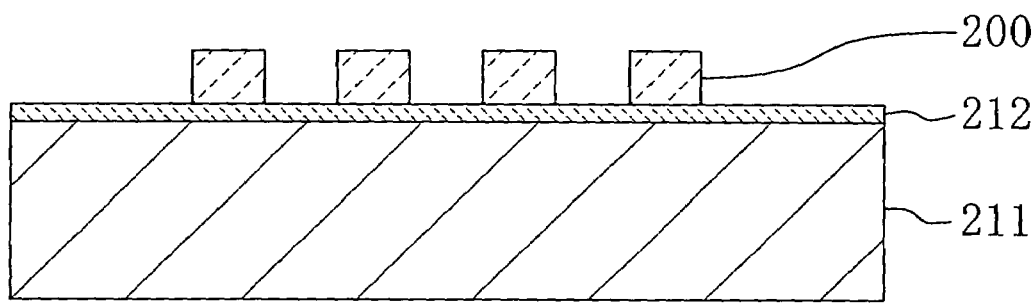

FIGS. 20A and 20B illustrate the manufacturing method of the second embodiment. FIG. 20A is a cross-sectional view of the memory cell array taken along line E-E of FIG. 16 and FIG. 20B is a cross-sectional view of the memory cell array taken along line F-F of FIG. 16.

As shown in FIGS. 20A and 20B, a charge trapping layer 212 is formed on the P-type well 211 and the element isolation insulating films 201, and word line electrodes 200 are formed on the charge trapping layer 212.

Figure 21A:
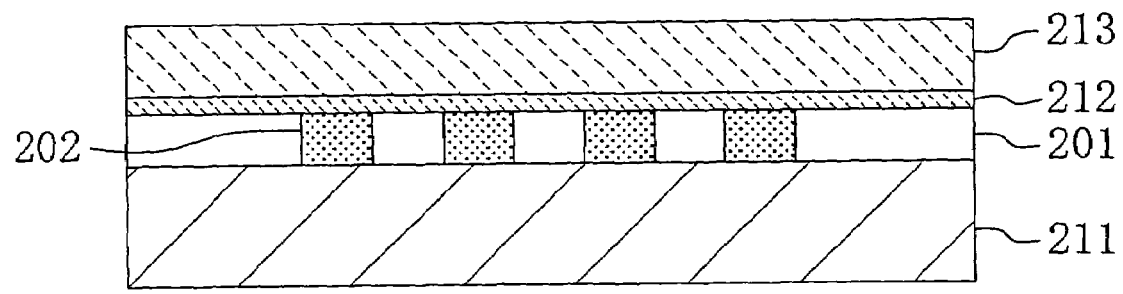
Figure 21B:
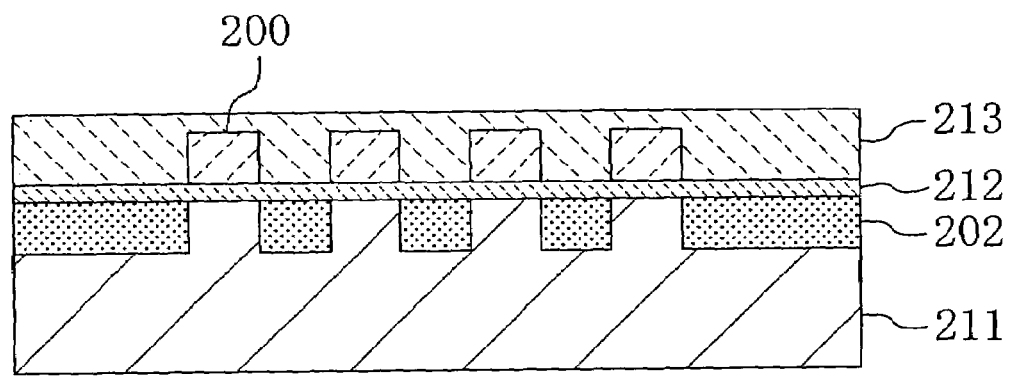

FIGS. 21A and 21B illustrate the manufacturing method of the second embodiment. FIG. 21A is a cross-sectional view of the memory cell array taken along line E-E of FIG. 16 and FIG. 21B is a cross-sectional view of the memory cell array taken along line F-F of FIG. 16.

As shown in FIGS. 21A and 21B, impurity diffusion layers 202 are formed in the surface portion of the P-type well 211 by using the word line electrodes 200 as a mask. A polysilicon pre-growth insulating film 213 is then formed on the charge trapping layer 212 so as to cover the word line electrodes 200.

Figure 22A:
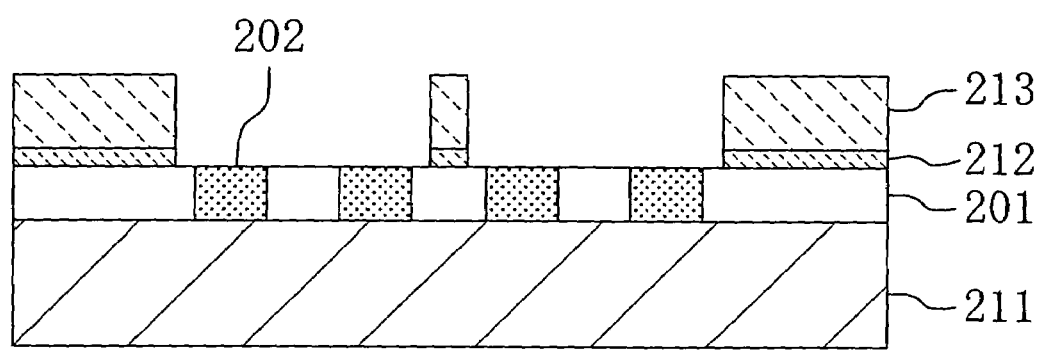
Figure 22B:
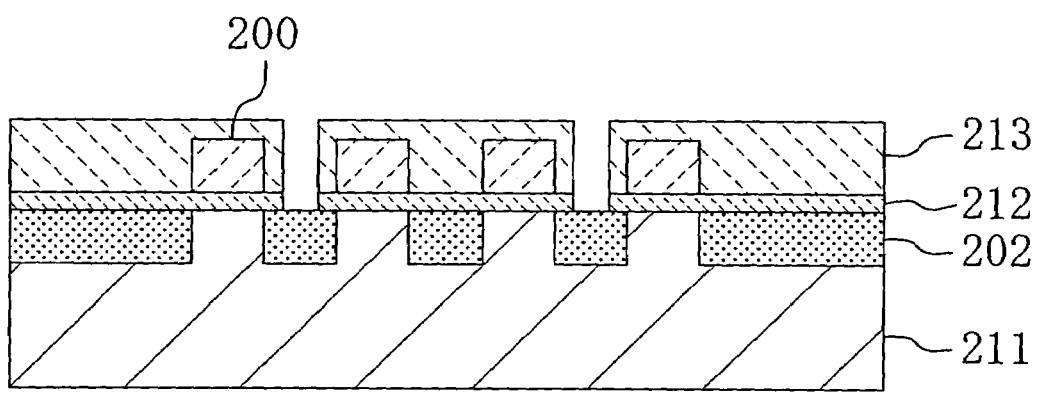

FIGS. 22A and 22B illustrate the manufacturing method of the second embodiment. FIG. 22A is a cross-sectional view of the memory cell array taken along line E-E of FIG. 16 and FIG. 22B is a cross-sectional view of the memory cell array taken along line F-F of FIG. 16.

The polysilicon pre-growth insulating film 213 and the charge trapping layer 212 are patterned so that the regions of the polysilicon pre-growth insulating film 213 and the charge trapping layer 212 which are located on the impurity diffusion layers 202 are removed in the cross section of FIG. 22A and so that the word line electrodes 200 are kept covered with the polysilicon pre-growth insulating film 213 in the cross section of FIG. 22B.

Figure 23A:
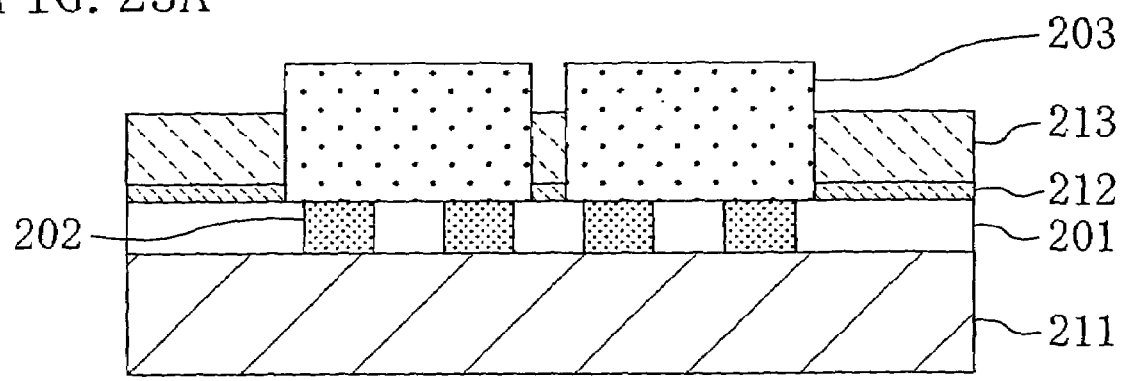
Figure 23B:
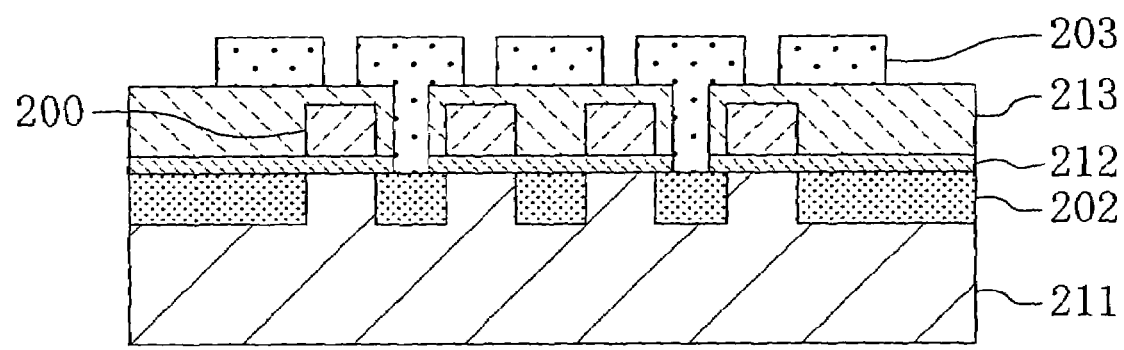

FIGS. 23A and 23B illustrate the manufacturing method of the second embodiment. FIG. 23A is a cross-sectional view of the memory cell array taken along line E-E of FIG. 16 and FIG. 23B is a cross-sectional view of the memory cell array taken along line F-F of FIG. 16.

In the cross section of FIG. 23A, polysilicon wirings 203 are formed in the regions where the polysilicon pre-growth insulating film 213 and the charge trapping layer 212 are removed by the patterning process. Each polysilicon wiring 203 electrically connects to corresponding adjacent two source/drain diffusion layers 202 of the row direction and completely covers the source/drain diffusion layers 202. In the cross section of FIG. 23B, polysilicon wirings 203 are formed on the polysilicon pre-growth insulating film 213 so as to cover the ends of the word line electrodes 200 which face the respective source/drain diffusion layers 202. Note that the polysilicon wirings 203 electrically connect to every other source/drain diffusion layer 202. The word line electrodes 200 are thus insulated from the polysilicon wirings 203 by the polysilicon pre-growth insulating films 213.

Figure 24A:
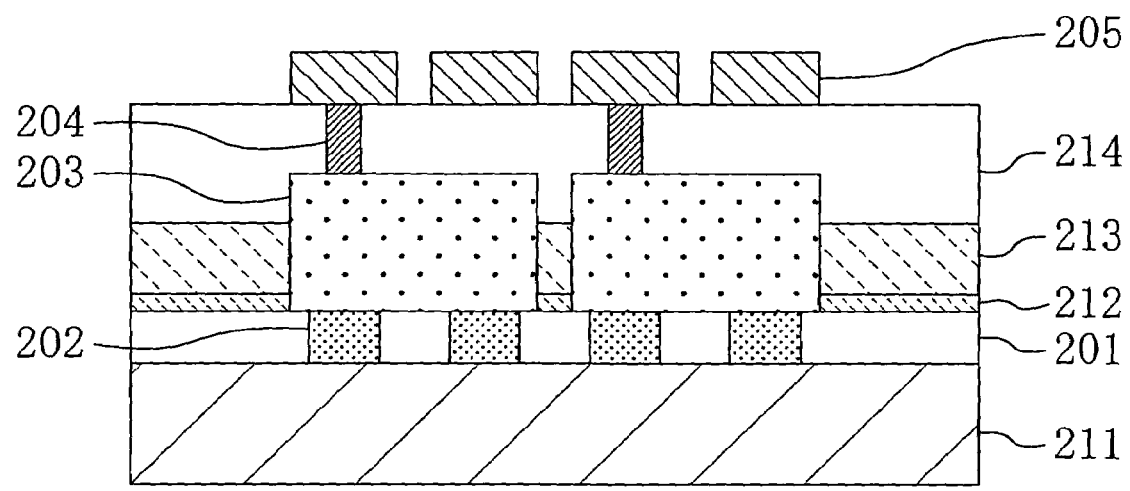
Figure 24B:
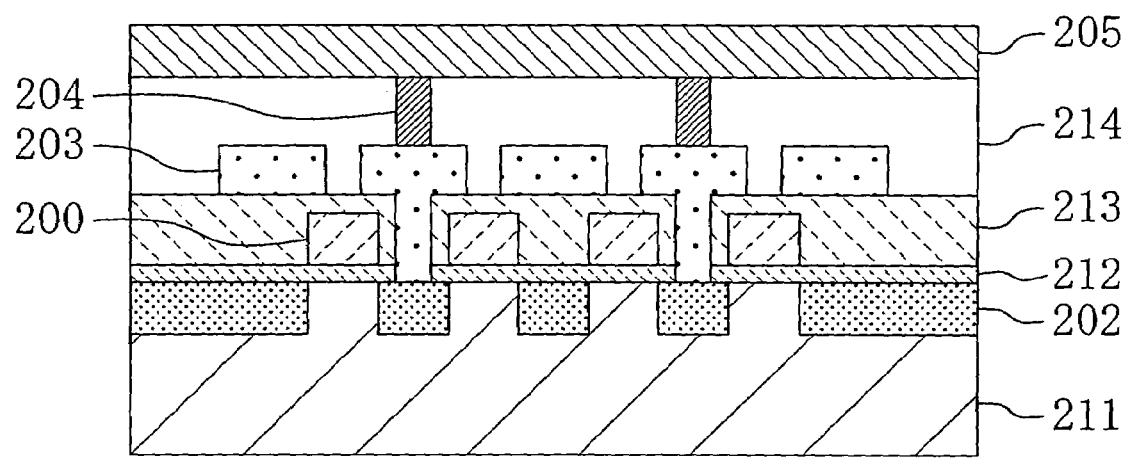
Figure 25:
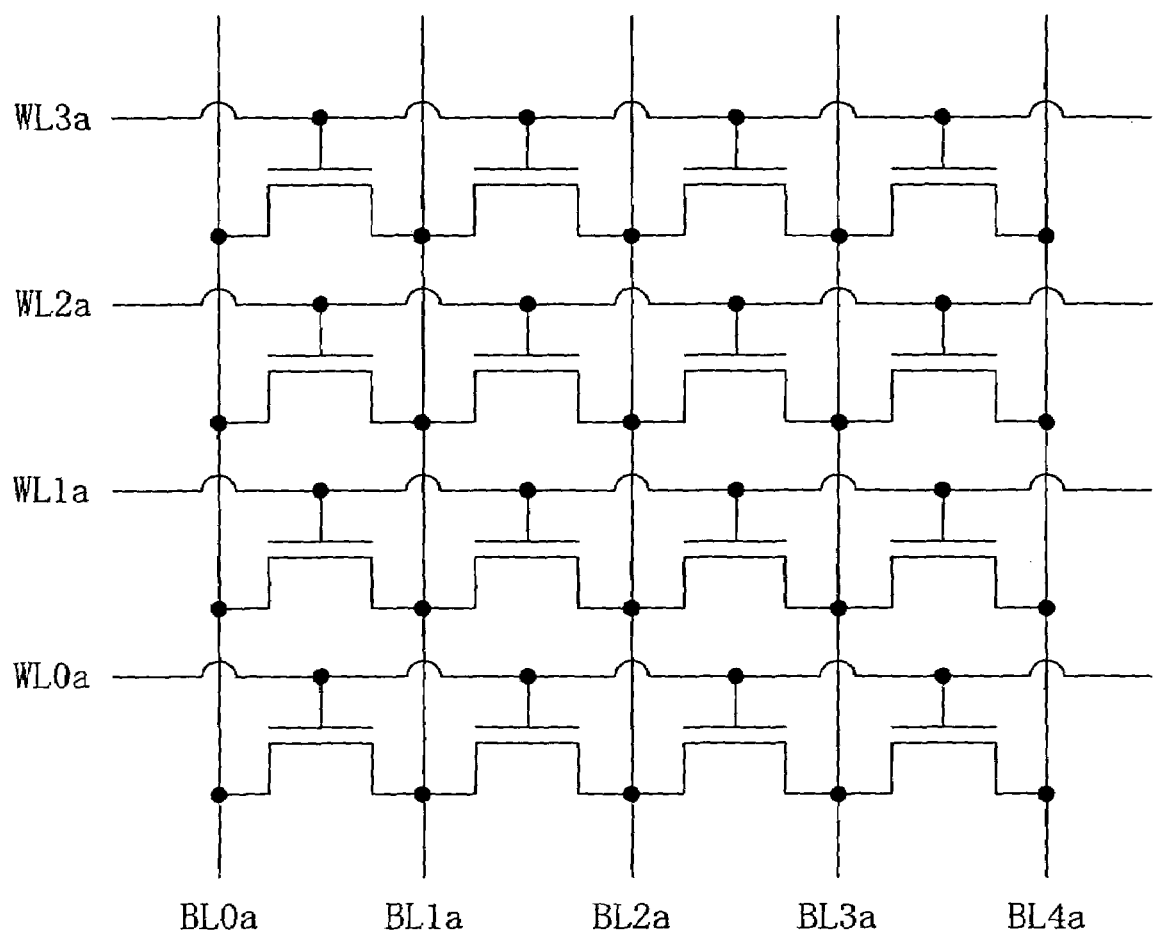
FIG. 25 is a circuit diagram showing an electric connection method of a common memory cell array.

FIGS. 24A and 24B illustrate the manufacturing method of the second embodiment. FIG. 24A is a cross-sectional view of the memory cell array taken along line E-E of FIG. 16 and FIG. 24B is a cross-sectional view of the memory cell array taken along line F-F of FIG. 16.

As shown in FIGS. 24A and 24B, a first interlayer insulating film 214 is formed on the polysilicon pre-growth insulating film 213 and the polysilicon wirings 203, and contacts 204 are then formed in the first interlayer insulating film 214. Each contact 204 extends through the first interlayer insulating film 214 and connects to the top surface of a corresponding polysilicon wiring 203. First metal wirings 205 are then formed on the first interlayer insulating film 214 and the contacts 204. In the cross section of FIG. 24A, every other first metal wiring 205 connects to the top end of a corresponding contact 204.

As shown in FIGS. 18A and 18B, a second interlayer insulating film 215 is then formed on the first interlayer insulating film 214 so as to cover the first metal wirings 205, and a surface protective film 216 is formed on the second interlayer insulating film 215.

As described above, the source/drain diffusion layers 202 are covered with the polysilicon wirings 203 and the ends of the word line electrodes 200 are also covered with the polysilicon wirings 203. This structure can prevent UV rays which are generated in any step after formation of the polysilicon wirings 203 from impinging on the source/drain diffusion layers 202. The first metal wirings 205 cover the source/drain diffusion layers 202 and the word line electrodes 200. This structure can prevent at least UV rays which are generated in any step after formation of the first metal wirings 205 from impinging directly onto the word line electrodes 200 and can prevent such UV rays from being partially reflected from the word line electrodes 200 onto the source/drain diffusion layers 202.

The use of polysilicon wirings as in the second embodiment can reduce the memory cell size but complicates the manufacturing process. Therefore, an optimal method needs to be selected as appropriate according to applications. The second embodiment can shield UV rays which are generated in any step after formation of the polysilicon wirings 203. Since the first embodiment shields UV rays which are generated in any step after formation of the first metal wirings 205, the second embodiment has a higher UV-shielding effect than that of the first embodiment.

Like the first embodiment, when memory cells have a wide gate width, at least the regions of the word line electrodes 200 which are located on the portions to which a source-drain current is to be applied need only be covered when viewed two-dimensionally. Therefore, the ends of the word line electrodes 200 which face the source/drain diffusion layers 202 need only be covered by the polysilicon wirings 203 or the first metal wirings 205 when viewed two-dimensionally.

In the above embodiments, the charge trapping layer is formed from a silicon oxide film, a silicon nitride film, a multi-layer film including a silicon oxide film and a silicon nitride film, or the like. However, the present invention is applicable even when the charge trapping layer is formed from a silicon oxide film with fine silicon lumps dispersed therein (silicon nanocrystal structure).

As has been described above, the present invention is useful for a method for producing a nonvolatile semiconductor memory device which uses a non-conductive charge trapping layer for memory elements.

What is claimed is:

1. A nonvolatile semiconductor memory device, comprising:
   a memory cell array having nonvolatile semiconductor memory elements arranged in a matrix in a word line direction and a bit line direction, each nonvolatile semiconductor memory element including a gate insulating film including a charge tapping layer formed on a substrate, a gate electrode formed on the gate insulating film, and a pair of diffusion layers formed in a surface layer of the substrate with the gate electrode interposed therebetween and functioning as a source or a drain;
   first conductors for electrically connecting adjacent diffusion layers of adjacent nonvolatile semiconductor memory elements of the word line direction; and
   bit lines for electrically connecting a plurality of the first conductors arranged in the bit line direction,
   wherein ends of each gate electrode which respectively face a pair of diffusion layers of a corresponding nonvolatile semiconductor memory element are partially covered by the first conductor when viewed two-dimensionally.

2. The nonvolatile semiconductor memory device according to claim 1, wherein the ends of each gate electrode which respectively face a pair of diffusion layers of a corresponding nonvolatile semiconductor memory element are completely covered by the first conductor when viewed two-dimensionally.

3. The nonvolatile semiconductor memory device according to claim 1, wherein the first conductor is formed from polysilicon with a thickness of at least 50 mm.

4. The nonvolatile semiconductor memory device according to claim 1, wherein the first conductor is formed from a metal wiring.

5. The nonvolatile semiconductor memory device according to claim 1, wherein the first conductor includes a first contact and a first wiring, the first contact being formed from a metal and having its bottom end connecting to the diffusion layers, and the first wiring being formed from a metal and having its bottom surface connecting to a top end of the first contact.

6. The nonvolatile semiconductor memory device according to claim 1, wherein the charge trapping layer has a multi-layer structure including a silicon oxide film and a silicon nitride film.

7. The nonvolatile semiconductor memory device according to claim 1, wherein the charge trapping layer is formed from a silicon oxide film with fine silicon lumps dispersed therein.

8. A nonvolatile semiconductor memory device, comprising:
   a memory cell array having nonvolatile semiconductor memory elements arranged in a matrix in a word line direction and a bit line direction, each nonvolatile semiconductor memory element including a gate insulating film including a charge tapping layer formed on a substrate, a gate electrode formed on the gate insulating film, and a pair of diffusion layers formed in a surface layer of the substrate with the gate electrode interposed therebetween and functioning as a source or a drain; and
   bit lines for connecting every other pair of diffusion layers of a plurality of nonvolatile semiconductor memory elements arranged in the bit line direction, the bit lines including first conductors for electrically connecting adjacent diffusion layers of adjacent nonvolatile semiconductor memory elements of the word line direction, and second conductors for electrically connecting a plurality of first conductors arranged in the bit line direction, wherein
   ends of each gate electrode which respectively face a pair of diffusion layers of a corresponding nonvolatile semiconductor memory element are partially covered by a corresponding first conductor when viewed two-dimensionally.

9. The nonvolatile semiconductor memory device according to claim 8, wherein the ends of each gate electrode which respectively face a pair of diffusion layers of a corresponding nonvolatile semiconductor memory element are completely covered by a corresponding first conductor when viewed two-dimensionally.

10. The nonvolatile semiconductor memory device according to claim 8, wherein the first conductors are formed from polysilicon with a thickness of at least 50 nm.

11. The nonvolatile semiconductor memory device according to claim 8, wherein each of the first conductors is formed from a metal wiring.

12. The nonvolatile semiconductor memory device according to claim 8, wherein each of the first conductors includes a first contact and a first wiring, the first contact being formed from a metal and having its bottom end connecting to the diffusion layers, and the first wiring being formed from a metal and having its bottom surface connecting to a top end of the first contact.

13. The nonvolatile semiconductor memory device according to claim 8, wherein each of the second conductors includes a second contact and a second wiring, the second contact being formed from a metal and having its bottom end connecting to a top surface of a corresponding first conductor, and the second wiring being formed from a metal and having its bottom surface connecting to a top end of the second contact.

14. The nonvolatile semiconductor memory device according to claim 8, wherein the ends of each gate electrode which respectively face a pair of diffusion layers of a corresponding nonvolatile semiconductor memory element are partially covered by a corresponding second conductor when viewed two-dimensionally.

15. The nonvolatile semiconductor memory device according to claim 8, wherein the ends of each gate electrode which respectively face a pair of diffusion layers of a corresponding nonvolatile semiconductor memory element are completely covered by a corresponding second conductor when viewed two-dimensionally.

16. The nonvolatile semiconductor memory device according to claim 8, wherein the charge trapping layer has a multi-layer structure including a silicon oxide film and a silicon nitride film.

17. The nonvolatile semiconductor memory device according to claim 8, wherein the charge trapping layer is formed from a silicon oxide film with fine silicon lumps dispersed therein.

18. A nonvolatile semiconductor memory device, comprising:
 a memory cell array having nonvolatile semiconductor memory elements arranged in a matrix in a word line direction and a bit line direction, each nonvolatile semiconductor memory element including a gate insulating film including a charge trapping layer formed on a substrate, a gate electrode formed on the gate insulating film, and a pair of diffusion layers formed in a surface layer of the substrate with the gate electrode interposed therebetween and functioning as a source or a drain; and
 bit lines for connecting every other pair of diffusion layers of a plurality of nonvolatile semiconductor memory elements arranged in the bit line direction, the bit lines including first conductors for electrically connecting adjacent diffusion layers of adjacent nonvolatile semiconductor memory elements of the word line direction, and second conductors for electrically connecting a plurality of first conductors arranged in the bit line direction, wherein
 ends of each gate electrode which respectively face a pair of diffusion layers of a corresponding nonvolatile semiconductor memory element are partially covered by a corresponding second conductor when viewed two-dimensionally.

19. The nonvolatile semiconductor memory device according to claim 18, wherein the ends of each gate electrode which respectively face a pair of diffusion layers of a corresponding nonvolatile semiconductor memory element are completely covered by a corresponding second conductor when viewed two-dimensionally.

20. The nonvolatile semiconductor memory device according to claim 18, wherein the charge tapping layer has a multi-layer structure including a silicon oxide film and a silicon nitride film.

21. The nonvolatile semiconductor memory device according to claim 18, wherein the charge trapping layer is formed from a silicon oxide film with fine silicon lumps dispersed therein.

* * * * *